(12) United States Patent
Iwata et al.

(10) Patent No.: US 6,191,632 B1
(45) Date of Patent: Feb. 20, 2001

(54) CLOCK GENERATION CIRCUIT AND SEMICONDUCTOR INTEGRATED CIRCUIT

(75) Inventors: Toru Iwata, Osaka; Hironori Akamatsu, Hirakata, both of (JP)

(73) Assignee: Matsushita Electric Industrial Co., Ltd., Osaka (JP)

( * ) Notice: Under 35 U.S.C. 154(b), the term of this patent shall be extended for 0 days.

(21) Appl. No.: 09/359,727

(22) Filed: Jul. 23, 1999

(30) Foreign Application Priority Data

Jul. 24, 1998 (JP) .................................................. 10-208746

(51) Int. Cl.$^7$ .................................................. H03K 3/00
(52) U.S. Cl. ........................... 327/295; 327/262; 327/271
(58) Field of Search ..................................... 327/291, 293, 327/295, 243, 258, 262, 269, 271, 272, 284, 285

(56) References Cited

U.S. PATENT DOCUMENTS 5,892,384 * 4/1999 Yamada et al. ...................... 327/277

FOREIGN PATENT DOCUMENTS 9-134226    5/1997 (JP) .
11-85310    3/1999 (JP) .

* cited by examiner

*Primary Examiner*—Timothy P. Callahan
*Assistant Examiner*—An T. Luu
(74) *Attorney, Agent, or Firm*—Wenderoth, Lind & Ponack, L.L.P.

(57) ABSTRACT

A clock generation circuit comprises a clock wiring having opposed first and second ends, through which a clock is transmitted from the first end to the second end, and a plurality of clock phase adjustment circuits for generating internal clocks in accordance with the clock supplied from the clock wiring. Each of the clock phase adjustment circuits comprises a first-end side terminal and a second-end side terminal which are connected to a first-end side point and a second-end side point of the circuit, respectively, the points being positioned on both sides of a reference point of the clock wiring; a delay line for delaying a clock supplied from one of the terminals and outputting an internal clock; and a delay control circuit for performing feedback control on a delay of the clock in the delay means in accordance with the phase of the clock supplied from the other terminal so that the phase of the internal clock matches the phase of the clock at the reference point of the cock wiring. Therefore, regardless of the distances from the first end (clock input end) of the clock wiring to the respective clock phase adjustment circuits, internal clocks of the same phase are output from the clock phase adjustment circuits.

15 Claims, 11 Drawing Sheets

Fig.2 (b) waveform of input clock CK

Fig.2 (c) waveform of forward clock CKg at Bf

Fig.2 (d) waveform of backward clock CKr at Bb

Fig.2 (e) waveform of internal clock CLKB

Fig.2 (f) waveform of delayed internal clock DCLKB

Fig.4 (b) waveform of input clock CK

Fig.4 (c) waveform of forward clock CKg at Bf

Fig.4 (d) waveform of backward clock CKr at Bb

Fig.4 (e) waveform of internal clock CLKB

Fig.4 (f) waveform of delayed internal clock DCLKB

CLOCK GENERATION CIRCUIT AND SEMICONDUCTOR INTEGRATED CIRCUIT

FIELD OF THE INVENTION

The present invention relates to a clock generation circuit and a semiconductor integrated circuit and, more particularly, to a circuit construction for generating a clock (internal clock) having no phase error due to the location of the circuit in a semiconductor integrated circuit, in accordance with a clock (external clock) supplied from the outside of the semiconductor integrated circuit.

BACKGROUND OF THE INVENTION

Recently, in data transfer processing, a method of inputting/outputting data in synchronization with a clock is employed to realize high-speed data transfer.

Especially in a frequency region where a clock frequency exceeds 100 MHz, it is necessary to synchronize an external clock and an internal clock by using a feedback control system such as a PLL (Phase-Locked Loop) or a DLL (Delay-Locked Loop).

Further, also in a semiconductor integrated circuit such as an LSI (Large Scale Integrated circuit), there exists a skew (phase error between clocks) depending on the distance from a clock supply circuit.

In order to reduce the influence of skew, a conventional semiconductor integrated circuit is provided with driver circuits and DLL circuits which are located in several positions on a clock supply wiring inside the circuit.

Hereinafter, a brief description will be given of the conventional semiconductor integrated circuit. When a clock wiring driven by a clock generation circuit is long, the output impedance of a driver circuit win the clock generation circuit to the wiring load cannot be sufficiently reduced, whereby inclination of edges of a clock waveform increases, resulting in an increase in delay time of a clock in the clock wiring. In order to solve this problem, in the conventional semiconductor integrated circuit, driver circuits are inserted in several positions of the clock wiring to prevent the waveform from rounding, and a delay of the clock due to the driver circuits is canceled by using DLL circuits.

In the conventional semiconductor integrated circuit, since a delay caused by the driver circuits is canceled by the DLL circuits, a pulse having a waveform of steep edges can be transmitted as a clock. However, a delay of the clock caused by the resistance and capacitance of the wiring cannot be eliminated.

According to the existing LSI manufacturing process conditions, the time constant of a metal wiring having a width of 1 $\mu$m and a length of 1 cm is about 1 ns and, therefore, it is difficult to realize an LSI operating at several hundreds of MHz by using such metal wiring.

SUMMARY OF THE INVENTION

The present invention is made to solve the above-described problems and has for its object to provide a clock generation circuit which can generates internal clocks of the same phase regardless of positions in a semiconductor integrated circuit.

It is another object of the present invention to provide a semiconductor integrated circuit in which input data is latched by using the above-mentioned clock generation circuit.

Other objects and advantages of the invention will become apparent from the detailed description that follows.

The detailed description and specific embodiments described are provided only for illustration since various additions and modifications within the scope of the invention will be apparent of those of skill in the art from the detailed description.

According to a first aspect of the present invention, there is provided a clock generation circuit comprising a clock wiring having opposed first and second ends, through which a clock is transmitted from the first end to the second end, and a plurality of clock phase adjustment circuits for generating internal clocks in accordance with the clock supplied from the clock wiring. Each of the clock phase adjustment circuits comprises a first-end side terminal and a second-end side terminal which are connected to a first-end side point and a second-end side point of the circuit, respectively, the points being positioned on both sides of a reference point of the clock wiring; delay means for delaying a clock supplied from one of the terminals and outputting an internal clock; and delay control means for performing feedback control on a delay of the clock in the delay means in accordance with the phase of the clock supplied from the other terminal so that the phase of the internal clock matches the phase of the clock at the reference point of the clock wiring. Therefore, internal clocks of the same phase are output from the respective clock phase adjustment circuits, and the internal clocks of the same phase can be supplied to everywhere in a semiconductor integrated circuit including the clock generation circuit. As the result, data can be stably latched by using the internal clocks in every position in the semiconductor integrated circuit.

According to a second aspect of the present invention, in the clock generation circuit of the first embodiment, the clock wiring is turned down at the reference point such that a portion of the wiring from the first end to the reference point and a portion of the wiring from the reference point to the second end are positioned in parallel with each other, and the distance from the first-end side point to the reference point of the clock wiring corresponding to each clock phase adjustment circuit is equal to the distance from the second-end side point to the reference point of the clock wiring corresponding to each clock phase adjustment circuit. Therefore, when the respective clock adjustment circuits are arranged along the clock wiring, the distances from the first-end side point and the second-end side point of the clock wiring to the first-end side terminal and the second-end side terminal of each clock phase adjustment circuit can be reduced. In addition, the distance from the first-end side point of the clock wiring to the first-end side terminal of the clock phase adjustment circuit can be approximately equal to the distance from the second-end side point of the clock wiring to the second-end side terminal of the clock phase adjustment circuit.

According to a third aspect of the present invention, in the clock generation circuit of the second aspect, the delay means delays the clock input to the first-end side terminal of the clock phase adjustment circuit to output the internal clock, and the delay control means performs feedback control on a delay of the clock in the delay means in accordance with the phase of the clock input to the second-end side terminal of the clock phase adjustment circuit so that the phase of the internal clock matches the phase of the clock at the reference point of the clock wiring. Therefore, the phase difference between the internal clock and the input clock applied to the input end (first end) of the clock wiring can be reduced.

According to a fourth aspect of the present invention, in the clock generation circuit of the third aspect, the clock phase adjustment circuit further comprises additional delay means for delaying the internal clock output from the delay means and outputting the delayed internal clock; phase comparison means for comparing the phase of the delayed internal clock with the phase of the clock input to the second-end side terminal of the clock phase adjustment circuit and outputting a phase comparison signal indicating the result of the comparison; and the delay control circuit performing feedback control in accordance with the phase comparison signal so that the delay in the delay means becomes equal to the delay in the additional delay means, and the phase of the internal clock matches the phase of the clock at the reference point of the clock wiring. Therefore, the delay means and the additional delay means can be implemented by the same delay circuit and, furthermore, the delays in the respective delay means are always constant, whereby delay control is simplified.

According to a fifth aspect of the present invention, in the clock generation circuit of the second aspect, the delay means delays the clock input to the second-end side terminal of the clock phase adjustment circuit and outputs the internal clock, and the delay control means performs feedback control on a delay of the clock in the delay means in accordance with the phase of the clock input to the first-end side terminal of the clock phase adjustment circuit so that the phase of the internal clock matches the phase of the clock at the reference point of the clock wiring. Therefore, the phase difference of the internal clock from the input clock applied to the input end of the clock wiring can be set to a relatively large value.

According to a sixth aspect of the present invention, in the clock generation circuit of the fifth aspect, the clock phase adjustment circuit further comprises additional delay means for delaying the internal clock output from the delay means and outputting the delayed internal clock; phase comparison means for comparing the phase of the delayed internal clock with the phase of the clock input to the first-end side terminal of the clock phase adjustment circuit and outputting a phase comparison signal indicating the result of the comparison; and the delay control circuit performing feedback control in accordance with the phase comparison signal so that the delay in the delay means becomes equal to the delay in the additional delay means, and the phase of the internal clock matches the phase of the clock at the reference point of the clock wiring. Therefore, the delay means and the additional delay means can be implemented by the same delay circuit and, furthermore, the delays in the respective delay means are always constant, whereby delay control is simplified.

According to a seventh aspect of the present invention, the clock generation circuit of the second aspect further comprises clock delay means inserted in the turn point of the clock wiring, for delaying the clock transmitted in the clock wiring by a predetermined period of time. Therefore, even when a minimum time which can be generated as a clock delay time in the clock phase adjustment means is longer than the time required for transmitting the clock from the first-end side point of the clock wiring through the turn point to the send-end side point, the clock phase adjustment circuit can output the internal clock.

According to an eighth aspect of the present invention, the clock generation circuit of the first aspect further comprises first waveform shaping circuit inserted between adjacent first-end side points of the clock wiring, for performing waveform shaping on the clock transmitted in the clock wiring; and a second waveform shaping circuit inserted between adjacent second-end side points of the clock wiring, for performing waveform shaping on the clock transmitted in the clock wiring. In this circuit, a clock delay time in the first waveform shaping circuit positioned between a first-end side point corresponding to one of two adjacent clock phase adjustment circuits and a first-end side point corresponding to the other clock phase adjustment circuit is equal to a clock delay time in the second waveform shaping circuit positioned between a second-end side point corresponding to one of the two adjacent clock phase adjustment circuits and a second-end side point corresponding to the other clock phase adjustment circuit. Therefore, unwanted rounding of waveform of the clock transmitted in the clock wiring is suppressed, thereby generating an internal clock of high precision.

According to a ninth aspect of the present invention, the clock generation circuit of the first aspect further comprises reference clock delay means disposed on the clock wiring, for delaying the clock transmitted in the clock wiring so that the phase of an internal clock output from a specific one of the plural clock phase adjustment circuits becomes equal to the phase of the clock input to the first end of the clock wiring. Therefore, the phase of the internal clock can be approximated to the phase of the input to applied to the clock wiring from the outside.

According to a tenth aspect of the present invention, the clock generation circuit of the first aspect further comprises reference clock delay means disposed on the clock wiring, for delaying the clock transmitted in the clock wiring; and predetermined-time delay means disposed between the first end of the clock wiring and the reference clock delay means, for delaying the clock input to the first end of the clock wiring by a predetermined period of time. In this circuit, the phase of the internal clock output from a specific one of the plural clock phase adjustment circuits is equal to the phase of the input clock delayed by the predetermined time. Therefore, the phase of the internal clock can be arbitrarily set regardless of the phase of the input clock applied to the clock wiring.

According to an eleventh aspect of the present invention, in the clock generation circuit of the first aspect, each of the clock phase adjustment circuits performs feedback control on a delay in the delay means by using the delay control means, for a predetermined period of time, in accordance with a control signal supplied from the outside. Therefore, in the operating period other than the above-mentioned predetermined period, the clock applied to the clock wiring is delayed by a quantity which is set by the feedback control to generate the internal clock. So, after the delay of the clock is once set by the feedbacl control, even if the clock is intermittently applied to the clock wiring, the clock phase adjustment circuit generates a correct internal clock to be supplied.

According to a twelfth aspect of the present invention, there is provided a semiconductor integrated circuit comprising a clock generation circuit for generating an internal clock according to a clock supplied from the outside, a buffer for storing data supplied from the outside, and a latch circuit for latching the input datas output from the buffer in accordance with the internal clock. The clock generation circuit comprises a clock wiring having opposed first and second ends, through which a clock is transmitted from the first end to the second end; and a plurality of clock phase adjustment circuits for generating internal clocks in accordance with the clock supplied from the clock wiring. Each clock phase adjustment circuit comprises a first-end side terminal and a second-end side terminal which are connected to a first-end side point and a second-end side point of the circuit, respectively, the points being positioned on both sides of a reference point of the clock wiring; delay means for delaying a clock supplied from one of the terminals and outputting an internal clock; and delay control means for performing feedback control on a delay of the clock in the delay means in accordance with the phase of the clock supplied from the other terminal so that the phase of the internal clock matches the phase of the clock at the reference point of the clock wiring. Therefore, internal clocks of the same phase are applied to the components of the semiconductor integrated circuit, so that data can be latched precisely in the respective components of the semiconductor integrated circuit.

According to a thirteenth aspect of the present invention, in the semiconductor integrated circuit of the twelfth aspect, the clock wiring in the clock generation circuit is turned down at the reference point so that a portion of the wiring from the first end to the reference point and a portion of the wiring from the reference point to the second end are positioned in parallel with each other, and the distance from the first-end side point to the reference point of the clock wiring corresponding to each clock phase adjustment circuit is equal to the distance from the second-end side point to the reference point of the clock wiring corresponding to each clock phase adjustment circuit. Therefore, when the respective clock adjustment circuits are arranged along the clock wiring, the distances from the first-end side point and the second-end side point of the clock wiring to the first-end side terminal and the second-end side terminal of each clock phase adjustment circuit can be reduced. In addition, the distance from the first-end side point of the clock wiring to the first-end side terminal of the clock phase adjustment circuit can be approximately equal to the distance from the second-end side point of the clock wiring to the second-end side terminal of the clock phase adjustment circuit.

According to a fourteenth aspect of the present invention, in the semiconductor integrated circuit of the thirteenth aspect, each of the clock phase adjustment circuits in the clock generation circuit performs feedback control on a delay in the delay means by using the delay control means, for a predetermined period of time, in accordance with a control signal supplied from the outside. Therefore, in the operating period other than the above-mentioned predetermined period, the clock applied to the clock wiring is delayed by a quantity which is set by the feedback control to generate the internal clock. So, after the delay of the clock is once set by the feedback control, even if the clock is intermittently applied to the clock wiring in the semiconductor integrated circuit, the clock phase adjustment circuit generates a correct internal clock, and the latch circuit can latch the data accurately.

According to a fifteenth aspect of the present invention, the semiconductor integrated circuit of the fourteenth aspect further comprises data delay means disposed between the input buffer and the latch circuit, for delaying the input data output from the input buffer; and input data delay control means for controlling a delay in the data delay means so as to reduce variation of relative phase difference between the input data output from the buffer and the internal clock output from each clock phase adjustment circuit in the state where feedback control of a clock delay in the delay means in each clock phase adjustment means is not performed. Therefore, phase variation of the internal clock during the period when the clock delay is not subjected to feedback control is suppressed by the input data delay means, whereby the range of temperature variation in which the input data can be reliably latched is increased.

DETAILED DESCRIPTION OF PREFERRED EMBODIMENTS

Hereinafter, embodiments of the present invention will be described with reference to FIGS. 1 through 11.

Embodiment 1

Figure 1:
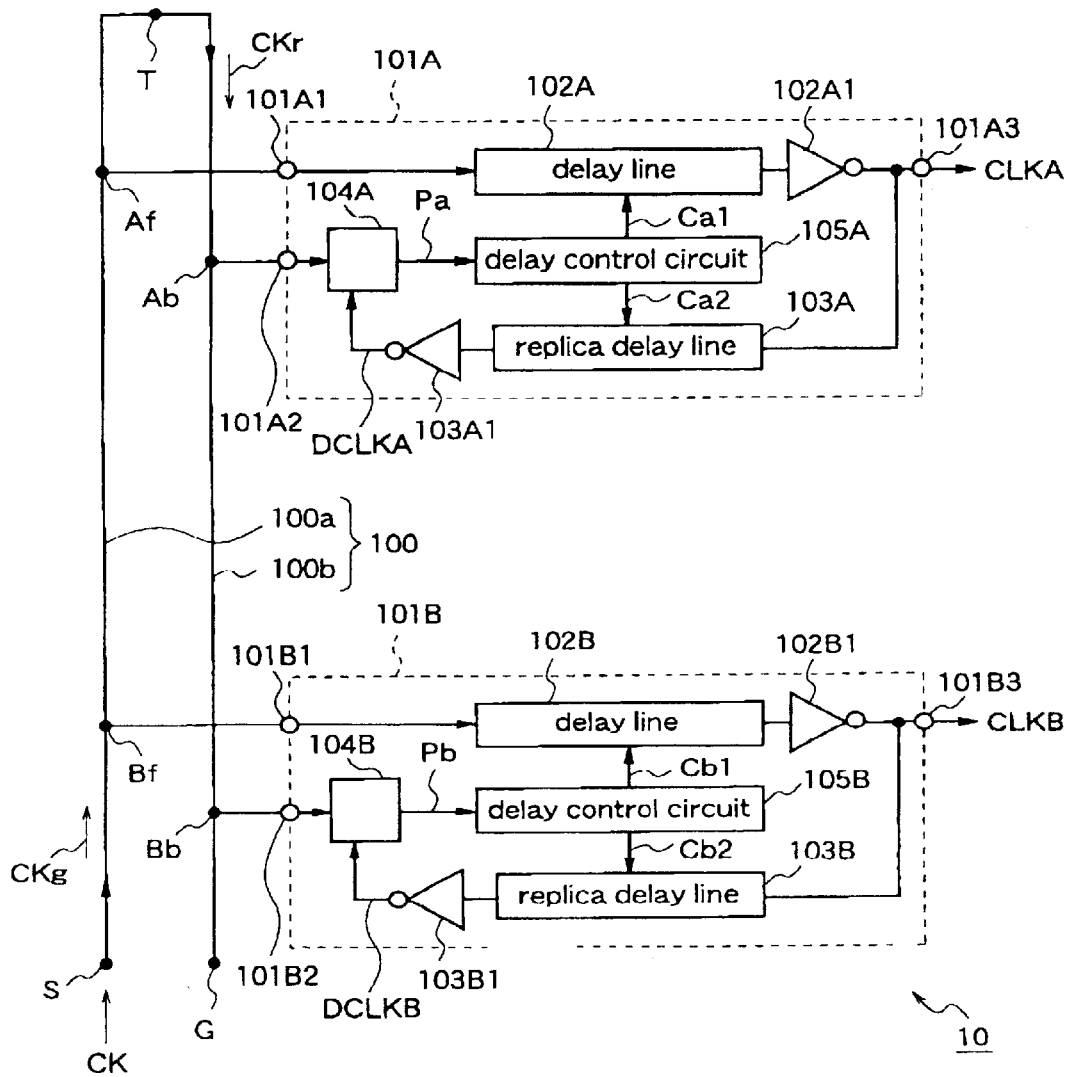
FIG. 1 is a block diagram for explaining a clock generation circuit according to a first embodiment of the present invention.

FIG. 1 is a block diagram for explaining a clock generation circuit 10 according to a first embodiment of the present invention.

The clock generation circuit 10 includes a clock wiring 100 to which a clock CK is input from the outside, and first and second clock phase adjustment circuits 101A and 101B connected to the clock wiring 100, for adjusting the phase of the clock transmitted through the clock wiring 100 by feedback control to output internal clocks CLKA and CLKB having the same phase difference from the external clock.

The clock wiring 100 is arranged such that a wiring of a predetermined length is turned down in the middle, and so the clock wiring 100 comprises a first portion 100a starting from the clock input end (first end) S to which the clock CK is supplied from the outside, to the turn point (reference point) T, and a second portion 100b starting from the turn point T to the other end (second end) G of the wiring 100. The first portion 100a and the second portion 100b are parallel with each other. In the following description, the clock traveling through the first portion 100a of the clock wiring 100 is called "forward clock CKg" while the clock traveling through the second portion 100b of the clock wiring 100 is called "backward clock CKr". Hence, the first portion 100a is called "forward clock path 100a" while the second portion 100b is called "backward clock path 100b".

Further, the first clock phase adjustment circuit 101A has a first input terminal (first-end side terminal) 101A1 and a second input terminal (second-end side terminal) 101A2. The first input terminal 101A1 is connected to a first-end side point (first supply point of forward clock) Af in the forward clock path 100*a* in the vicinity of the turn point T, and the forward clock CKg is input thereto. The second input terminal 101A2 is connected to a second-end side point (first supply point of backward clock) Ab in the backward clock path 100*b* in the vicinity of the turn point T, and the backward clock CKr is input thereto. The clock phase adjustment circuit 101A performs feedback control on the phase of the forward clock CKg in accordance with the phase of the backward clock CKr, thereby generating a clock CLKA (hereinafter referred to as a first internal clock) having the same phase as the phase of the clock at the turn point T. This first internal clock CLKA is output from an output terminal 101A3.

On the other hand, the second clock phase adjustment circuit 101B has a first input terminal 101B1 and a second input terminal 101B2. The first input terminal 101B1 is connected to a first-end side point (second supply point of forward clock) Bf in the forward clock path 100*a* in the vicinity of the clock input end S, and the backward clock CKr is input thereto. The second input terminal 101B2 is connected to a second-end side point (second supply point of backward clock) Bb in the backward clock path 100*b* in the vicinity of the second end G, and the backward clock CKr is input thereto. The clock phase adjustment circuit 101B performs feedback control on the phase of the forward clock CKg in accordance with the phase of the backward clock CKr, thereby generating a clock CLKB (hereinafter referred to as a second internal clock) having the same phase as the phase of the clock at the turn point T. This second internal clock CLKB is output from an output terminal 101B3.

Next, a description will be given of the detailed structures of the first and second clock phase adjustment circuits 101A and 101B.

The first clock phase adjustment circuit 101A includes a variable delay line 102A and a driver circuit 102A1. One end (first end) of the delay line 102A is connected to the first input terminal 101A1. The delay line 102A delays the phase of the forward clock CKg at the first forward clock supply point Af by a predetermined quantity according to a delay control signal Ca1, and outputs it from the other end (second end). The driver circuit 102A1 is connected to the second end of the delay line 102A. The driver circuit 102A1 performs waveform shaping on the clock output from the delay line 102A, and outputs the waveform-shaped clock as an internal clock CLKA.

Further, the phase adjustment circuit 101A includes a variable replica delay line 103A and a driver circuit 103A1. One end (first end) of the replica delay line 103A is connected to the output of the driver circuit 102A1. The replica delay line 103A delays the phase of the internal clock CLKA by the same quantity as the delay in the delay line 102A in accordance with a delay control signal Ca2, and outputs the delayed clock from the other end (second end). The driver circuit 103A1 is connected to the second end of the replica delay line 103A. The driver circuit 103A1 performs waveform shaping on the clock output from the delay line 103A, and outputs the waveform-shaped clock as a delayed internal clock DCLKA.

The phase adjustment circuit 101A further includes a phase comparator 104A. The phase comparator 104A compares the phase of the delayed internal clock DCLKA output from the driver circuit 103A1 with the phase of the backward clock CKr which has ben transmitted through the first backward clock supply point Ab of the clock wiring 100 to be input to the comparator 104A through the second input terminal 101A2, and outputs a phase comparison signal Pa corresponding to a phase difference of these clocks. Further, the phase adjustment circuit 101A includes a delay control circuit 105A. The delay control circuit 105A outputs the delay control signals Ca1 and Ca2 to delay line 102A and the replica delay line 103A, respectively, in accordance with the phase comparison signal Pa so that the phase of the delayed internal clock DCLKB from the replica delay line 103A becomes equal to the phase of the backward clock CKr at the first backward clock supply point Ab and, further, the clock delay in the delay line 102A becomes equal to the clock delay in the replica delay line 103A.

The second clock phase adjustment circuit 101B includes a variable delay line 102B and a driver circuit 102B1. One end (first end) of the delay line 102B is connected to the first input terminal 101B1. The delay line 102B delays the phase of the forward clock CKg at the second forward clock supply point Bf by a predetermined quantity according to a delay control signal Cb1, and outputs it from the other end (second end). The driver circuit 102B1 is connected to the second end of the delay line 102B. The driver circuit 102B1 performs waveform shaping on the clock output from the delay line 102B and outputs it as an internal clock CLKB.

Further, the phase adjustment circuit 101B includes a variable replica delay line 103B and a driver circuit 103B1. One end (first end) of the replica delay line 103B is connected to the output of the driver circuit 102B1. The replica delay line 103B delays the phase of the internal clock CLKB by the same quantity as the delay in the delay line 102B in accordance with a delay control signal Cb2, and outputs it from the other end (second end). The driver circuit 103B1 is connected to the second end of the replica delay line 103B. The driver circuit 103B1 performs waveform shaping on the clock output from the delay line 103B and outputs it as a delayed internal block DCLKB.

The phase adjustment circuit 101B further includes a phase comparator 104B. The phase comparator 104B compares the phase of the delayed internal clock DCLKB output from the driver circuit 103B1 with the phase of the backward clock CKr which has been transmitted through the second backward clock supply point Bb of the clock wiring 100 to be input to the comparator 104B through the second input terminal 101B2, and outputs a phase comparison signal Pb corresponding to a phase difference between these clocks. Further, the phase adjustment circuit 101B includes a delay control circuit 105B. The delay control circuit 105B outputs the delay control signals Cb1 and Cb2 to the delay line 102B and the replica delay line 103B, respectively, in accordance with the phase comparison signal Pb so that the phase of the delayed internal clock DCLKB from the replica delay line 103B becomes equal to the phase of the backward clock CKr at the second backward clock supply point Bb and, further, the clock delay in the delay line 102B becomes equal to the clock delay in the replica delay line 103B.

The respective constituents 102A, 102A1, 103A, 103A1, 104A, and 105A of the first clock phase adjustment circuit 101A are identical to the constituents 102B, 102B1, 103B, 103B1, 104B, and 105B of the second clock phase adjustment circuit 101B, respectively.

Next, the function and effect will be described.

Figure 2:
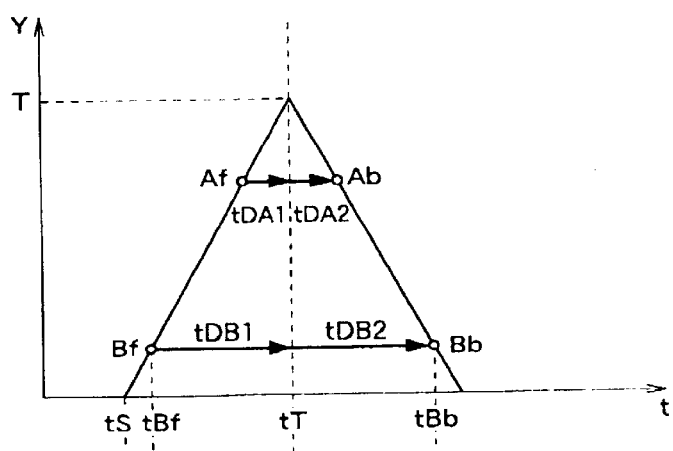
FIGS. 2(a)–2(f) are waveform diagrams for explaining the operation of the clock generation circuit according to the first embodiment.
Figure 2:
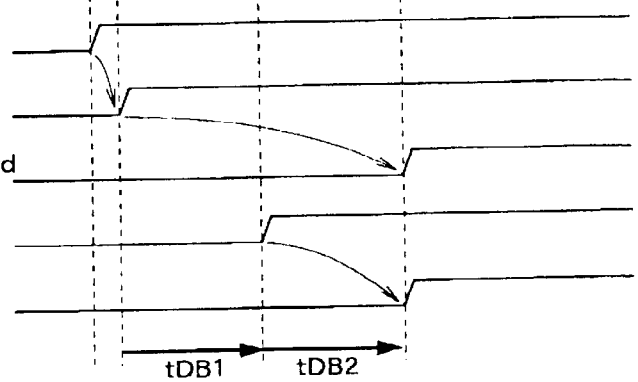

FIG. 2 is a waveform diagram for explaining the operation of the clock generation circuit 10 according to the first embodiment shown in FIG. 1. FIGS. 2(*b*)–2(*f*) illustrate waveforms of clocks in the second clock phase adjustment circuit 101B. It is needless to say that the operation of the first clock phase adjustment circuit 101A is identical to the operation of the second clock phase adjustment circuit 101B.

In FIG. 2(*a*), the relationship between the transmitted clock position Y on the clock wiring 100 and the lapsed time t after the clock is applied to the clock input end S is shown on a two-dimensional coordinate plane in which the abscissa shows the time t and the ordinate shows the position Y.

When the clock position Y is represented as the distance from the clock input end S of the clock wiring 100 to the clock position Y, the graph showing the relationship between the time and the position at which the clock rises on the clock wiring corresponds to two equal sides of an isosceles triangle on the coordinate plane, as shown in FIG. 2(*a*). Further, on the coordinate plane, the time at the intersection of the abscissa and the axis of symmetry of the isosceles triangle is the time when the clock rises at the turn point T (the time when the clock passes the turn point T).

FIGS. 2(*b*), 2(*c*), and 2(*d*) show the waveforms of then clocks at the clock input end S the second forward clock supply point Bf, and the second backward clock supply point Bb, respectively, and FIGS. 2(*e*) and 2(*f*) show the waveforms of the internal clock CLKB and the delayed internal clock DCLKB, respectively, which are output from the second clock phase adjustment circuit 101B.

Hereinafter, the operation of the clock generation circuit will be described.

Initially, a clock CK is input through the clock input end S to the clock wiring 100 at time tS (refer to FIG. 2(*b*)). Then, the clock CK travels in the forward clock path 100*a* of the clock wiring 100 as a forward clock CKg. When a predetermined period of time has passed (time tBf), the forward clerk CKg is supplied from the second forward clock supply point Bf of the clock wiring 100 to the first input terminal 101B1 of the clock phase adjustment circuit 101B (refer to FIG. 2(*c*)).

The forward clock CKg input to the first input terminal 101B1 of the clock phase adjustment circuit 101B is delayed by time tDB1 in the delay line 102B, and transmitted through the driver circuit 102B1 to be output as an internal clock CLKB from the output terminal 101B3 of the second clock phase adjustment circuit 101B. Further, the output (internal clock) CLKB of the driver circuit 102B1 is delayed by time tDB2 in the replica delay line 103B, and transmitted through the driver circuit 103B1 to be output as a delayed internal clock DCLKB to the phase comparator 104B.

At this time, the backward clock CKr transmitted through the backward clock path 100*b* of the clock wiring 100 is supplied from the second backward clock supply point Bb of the clock wiring 100 to the second input terminal 101B2 of the phase adjustment circuit 101B. In the phase comparator 104B, the phase of the delayed internal clock DCLKB from the driver circuit 103B1 (refer to FIG. 2(*d*)) is compared with the phase of the backward clock CKr from the second backward clock supply point Bb (refer to FIG. 2(*f*)). Then, according to the result of the phase comparison, a phase comparison signal Pb which indicates a lead or a delay of the phase of the delayed internal clock DCLKB with respect to the phase of the backward clock CKr is output from the phase comparator 104B to the delay control circuit 105B.

On receipt of the phase comparison signal Pb, the delay control circuit 105B outputs delay control signals Cb1 and Cb2 to the delay line 102B and the replica delay line 103B, respectively. In the delay line 102B and the replica delay line 103B, accordingly to the delay control signals Cb1 and Cb2, the clock delays are adjusted so that the phase of the delayed internal clock DCLKB from the driver circuit 103B1 matches the phase of the backward clock CKr from the second backward clock supply point Bb. Further, the clock delays in these delay lines are adjusted so that the delay time tDB1 of the clock in the delay line 102B (refer to FIG. 2(*e*)) becomes equal to the delay time tDB2 of the clock in the replica delay line 103B (refer to FIG. 2(*f*)).

As described above, in the clock phase adjustment circuit 101B, according to the result of comparison between the phase of the forward clock CKg delayed in this circuit and the phase of the backward clock CKr from the second backward clock supply point Bb of the clock wiring, the phase of the forward clock CKg from the second forward clock supply point Bf is feedback-controlled. Thereby, the internal clock CLKB having the same phase as the phase of the clock passing the turn point T of the clock wiring 100 is output from the clock phase adjustment circuit 101B.

The operation of the first clock phase adjustment circuit 101A is identical to the operation of the second clock phase adjustment circuit 101B, and it will be briefly described hereinafter.

Also in the first clock phase adjustment circuit 101A, as in the second clock phase adjustment circuit 101B, the phase of the forward clock CKg from the first forward clock supply point Af is feedback-controlled according to the result of comparison between the phase of the forward clock CKg delayed in this circuit 101A and the phase of the backward clock CKg from the first backward clock supply point Ab of the clock wiring.

To be specific, the forward clock CKg from the first forward clock supply point Af is delayed by the delay line 102A to be output as an internal clock CLKA through the driver circuit 102A1, and the internal clock CLKA is further delayed by the replica delay line 103A to be output as a delayed internal clock DCLKA through the driver circuit 103A1 to the phase comparator 104A. In the phase comparator 104A, the phase of the delayed internal clock DCLKA is compared with the phase of the backward clock CKr from the first backward clock supply point Ab, and a phase comparison signal Pa according to the result of the phase comparison is output to the delay control circuit 105A. The delay control circuit 105A outputs delay control signal Ca1 and Ca2 according to the phase comparison signal Pa to the delay line 102A and the replica delay line 103A. In each delay line, based on the delay control signal, the clock delay is adjusted so that the phase of the delayed internal clock DCLKA from the driver circuit 103A1 matches the phase of the backward clock CKr from the first backward clock supply point Ab. Further, the clock delays in these delay lines are adjusted so that the delay time tDA1 of the clock in the delay line 102A (refer to FIG. 2(*a*)) becomes equal to the delay time tDA2 of the clock in the replica delay line 103A (refer to FIG. 2(*a*)).

As described above, in the clock phase adjustment circuits 101A and 101B connected to the clock wiring 100, on receipt of the forward clock CKg and the backward clock CKr which travel through the clock wiring, the phase of the forward clock CKg is feedback-controlled according to the result of comparison between the phase of the forward clock CKg delayed in each circuit and the phase of the backward clock CKr from the clock wiring, thereby generating the internal clocks CLKA and CLKB each having the same phase as the phase of the clock passing the turn point T of the clock wiring 100. Therefore, regardless of the distances from the clock input end S to the respective clock phase adjustment circuits in the clock generation circuit, the respective clock phase adjustment circuits can output the internal clocks of the same phase.

While in this first embodiment the clock generation circuit includes two units of clock phase adjustment circuits, the number of clock phase adjustment circuits in the clock generation circuit is not restricted thereto. The clock generation circuit may include three or more clock generation circuits with the same effects as described above.

Embodiment 2

Figure 3:
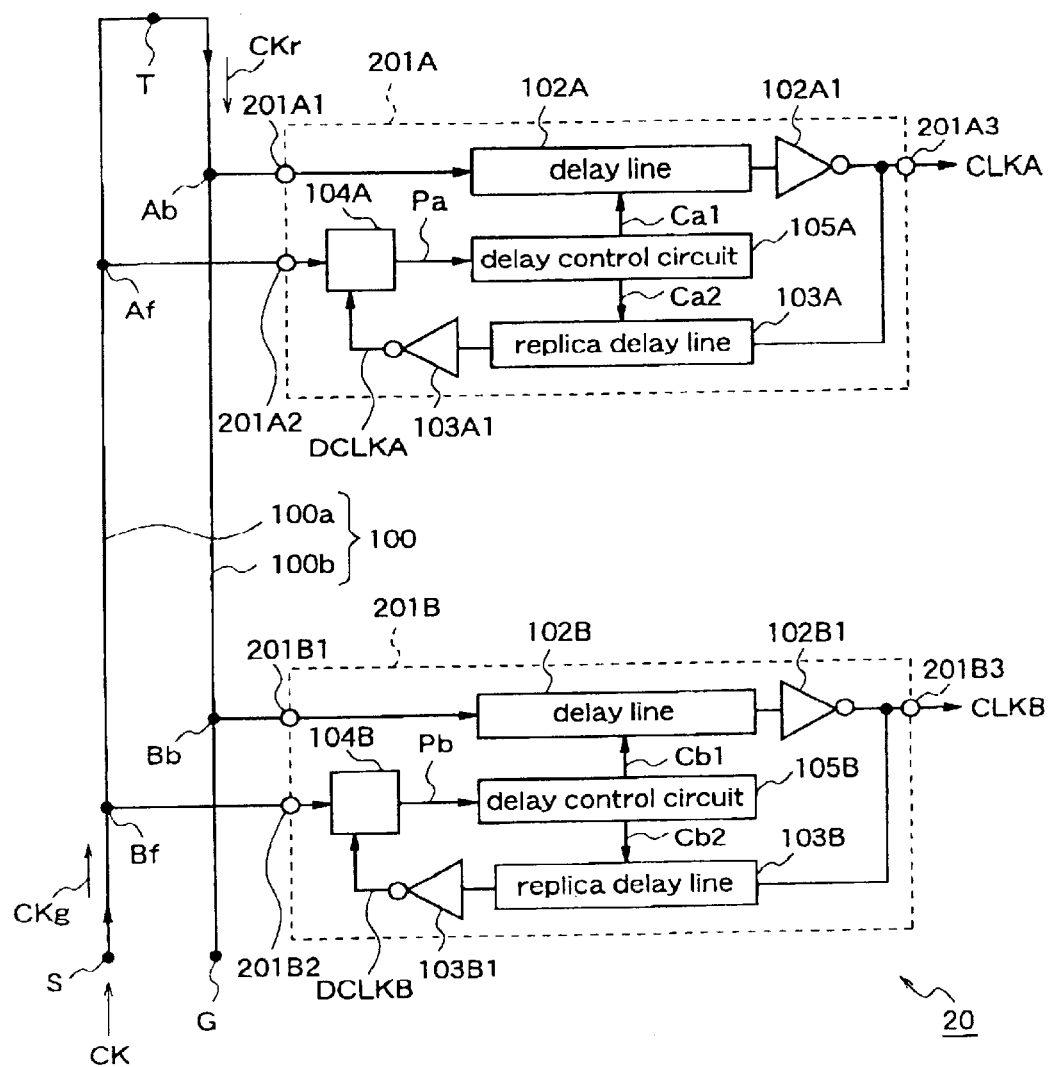
FIG. 3 is a block diagram for explaining a clock generation circuit according to a second embodiment of the present invention.

FIG. 3 is a block diagram for explaining a clock generation circuit 20 according to a second embodiment of the present invention. In FIG. 3, the same reference numerals as those shown in FIG. 1 designate the same or corresponding parts.

Like the clock generation circuit 10 of the first embodiment, the clock generation circuit 20 of this second embodiment comprises a clock wiring 100 to which a clock CK is supplied from the outside, and first and second clock phase adjustment circuits 201A and 201B connected to the clock wiring 100, for adjusting the phase of the clock transmitted through the clock wiring 100 by feedback control to output internal clocks CLKA and CLKB having the same phase difference from the external clock CK.

Like the first clock phase adjustment circuit 101A according to the first embodiment, the first clock phase adjustment circuit 201A comprises a delay line 102A, a replica delay line 103A, driver circuits 102A1 and 103A1, a phase comparator 104A, and a delay control circuit 105A.

In the first clock phase adjustment circuit 201A, a first input terminal 201A1 is connected to the first backward clock supply point Ab of the backward clock path 100b of the clock wiring 100 while a second input terminal 201A1 is connected to the first forward clock supply point Af of the forward clock path 100a of the clock wiring 100. That is, the backward clock CKr is applied to the delay line 102A while the forward clock CKg is applied to the phase comparator 104A.

The first clock phase adjustment circuit 201A of this second embodiment is different from the first clock phase adjustment circuit 101A of the first embodiment only in that the phase of the backward clock CKr from the first backward clock supply point Ab is feedback-controlled in accordance with the result of comparison between the phase of the backward clock CKr delayed in this circuit and the phase of the forward clock CKg from the first forward clock supply point Af of the clock wiring 100.

On the other hand, like the second clock phase adjustment circuit 101B according to the first embodiment, the second clock phase adjustment circuit 201B of this second embodiment comprises a delay line 102B, a replica delay line 103B, driver circuits 102B1 and 103B1, a phase comparator 104B, and a delay control circuit 105B.

In the second clock phase adjustment 201B, a first input terminal 201B1 is connected to the second backward clock supply point Bb of the backward clock path 100b of the clock wiring 100 while a second input terminal 201B2 is connected to the second forward clock supply point Bf of the forward clock path 100a of the clock wiring 100. That is, the backward clock CKr is applied to the delay line 102B while the forward clock CKg is applied to the phase comparator 104B.

The second clock phase adjustment circuit 201B of this second embodiment is different from the second clock phase adjustment circuit 101B of the first embodiment only in that the phase of the backward clock CKr from the second backward clock supply point Bb is feedback-controlled in accordance with the result of comparison between the phase of the backward clock CKr delayed in this circuit and the phase of the forward clock CKg from the second forward clock supply point Bf of the clock wiring 100.

Next, the function and effect will be described.

Figure 4:
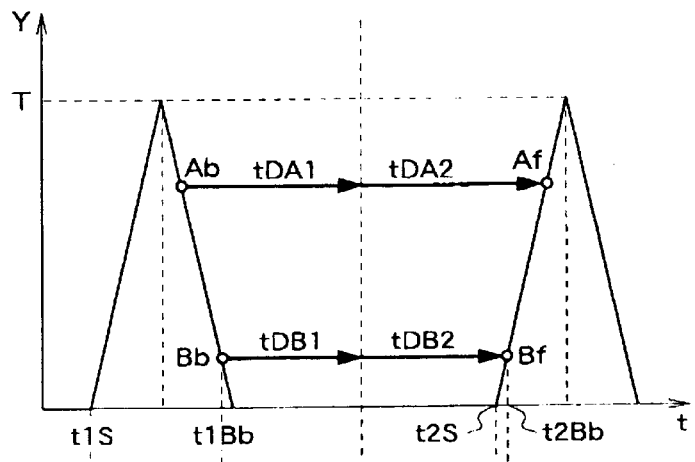
FIGS. 4(a)–4(f) are waveform diagrams for explaining the operation of the clock generation circuit according to the second embodiment.
Figure 4:
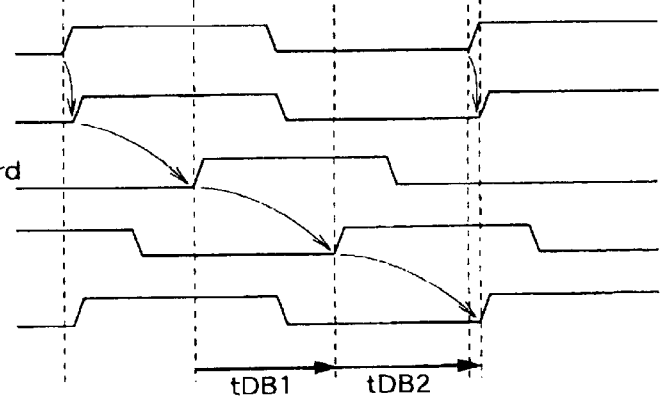

FIG. 4 is a waveform diagram for explaining the operation of the clock generation circuit 20 according to the second embodiment shown in FIG. 3.

FIG. 4(a) shows the relationship between the transmitted clock position Y on the clock wiring 100 and the elapsed time t after the clock is applied to the clock input end S, on a two-dimensional coordinate plane in which the abscissa show the time t and the ordinate shows the position Y. In FIG. 4(a), the relationship between the clock rise time and the position is shown over two cycles of the clock.

The graphs in the first and second cycles are identical in shape, and a part corresponding to two equal sides of an isosceles triangle in the first cycle is separated by one cycle from that in the second cycle.

FIGS. 4(b), 4(c), and 4(d) show the waveforms of clocks at the clock input end S, the second forward clock supply point Bf, and the second backward clock supply point Bb, respectively, and FIGS. 4(e) and 4(f) show the waveforms of the internal clock CLKB and the delayed internal clock DCLKB output from the second clock phase adjustment circuit 101B, respectively.

Hereinafter, a description will be given of the operation of the clock phase adjustment circuit.

Initially, when a clock CK is input to the clock input end S of the clock wiring 100 (refer to FIG. 4(b)), the clock CK travels through the forward clock path 100a as a forward clock CKg and through the backward clock path 100b as a backward clock CKr. It is assumed that, at the clock input end S, continuous first and second pulses of the clock CK rise at time t1S and time t2S, respectively.

When a predetermined period of time has passed from the first pulse rising time t1S at the clock input end S (time t1Bb), the first pulse of the backward clock CKr is supplied from the second backward clock supply point Bb of the clock wiring 100 to the second clock phase adjusting circuit 201B (refer to FIG. 4(d).

The first pulse of the backward clock CKr input to the second clock phase adjusting circuit 201B is delayed by time tDB1 in the delay line 102B, transmitted through the driver circuit 102B1, and outputted as the first pulse of the internal clock CLKB from the clock phase adjustment circuit 201B. Further, the first pulse of the output (internal clock) CLKB from the driver circuit 102B1 is delayed by time tDB2 in the replica delay line 103B, transmitted through the driver circuit 103B1, and outputted as the first pulse of the delayed internal clock DCLKB to the phase comparator 104B.

At this time, the second pulse of the forward clock CKg transmitted in the forward clock path 100a of the clock wiring 100 is supplied from the second forward clock supply point Bf of the clock wiring 100 to the phase comparator 104B. In the phase comparator 104B, the rising time of the first pulse of the delayed internal clock DCLKB from the driver circuit 103B1 (refer to FIG. 4(f)) is compared with the rising time of the second pulse of the forward clock CKg from the second forward clock supply point Bf (refer to FIG. 4(c)). Then, according to the result of the phase comparison, a phase comparison signal Pb which indicates a lead or a delay of the phase of the delayed internal clock DCLKB with respect to the phase of the forward clock CKg is output from the phase comparator 104B to the delay control circuit 105B.

On receipt of the phase comparison signal Pb, the delay control circuit 105B outputs delay control signals Cb1 and Cb2 to the delay line 102B and the replica delay line 103B, respectively. In the delay line 102B and the replica delay line 103B, according to the delay control signals Cb1 and Cb2, the clock delays are adjusted so that the phase of the delayed internal clock DCLKB from the driver circuit 103B1 matches the phase of the forward clock CKg from the second forward clock supply point Bf. Further, the clock delays in these delay lines are adjusted so that the delay time tDB1 of the clock in the delay line 102B (refer to FIG. 4(e)) becomes equal to the delay time tDB2 of the clock in the replica delay line 103B (refer to FIG. 4(f)).

As described above, in the clock phase adjustment circuit 201B, according to the result of comparison between the phase of the backward clock CKr delayed in this circuit and the phase of the forward clock CKg from the second forward clock supply point Bf of the clock wiring, the phase of the backward clock CKr from the second backward clock supply point Bb is feedback-controlled. Thereby, the internal clock CLKB having the same phase as the phase of the clock passing the turn point T of the clock wiring 100 is output from the clock phase adjustment circuit 201B.

The operation of the first clock phase adjustment circuit 201A is identical to the operation of the second clock phase adjustment circuit 201B, and it will be briefly described hereinafter.

Also in the first clock phase adjustment circuit 201A, as in the second clock phase adjustment circuit 201B, the phase of the backward clock CKr from the first backward clock supply point Ab is feedback-controlled according to the result of comparison between the phase of the backward clock CKr delayed in this circuit 201A and the phase of the forward clock CKg from the first forward clock supply point Af of the clock wiring 100.

To be specific, the backward clock CKr from the first backward clock supply point Ab is delayed by the delay line 102A to be output as an internal clock CLKA through the driver circuit 102A1, and the internal clock CLKA is further delayed by the replica delay line 103A to be output as a delayed internal clock DCLKA through the driver circuit 103A1 to the phase comparator 104A. In the phase comparator 104A, the rising time of the first pulse of the delayed internal clock DCLKA is compared with the rising time of the second pulse of the forward clock CKg from the first forward clock supply point Af, and a phase comparison signal Pa according to the result of the phase comparison is output to the delay control circuit 105A. The delay control circuit 105A outputs delay control signal Ca1 and Ca2 according to the phase comparison signal Pa to the delay line 102A and the replica delay line 103A, respectively. In each delay line, based on the delay control signal, the clock delay is adjusted so that the phase of the delayed internal clock DCLKA from the driver circuit 103A1 matches the phase of the forward clock CKg from the first forward clock supply point Af. Further, the clock delays in these delay line 102A (refer to FIG. 4(a)) becomes equal to the delay time tDA2 of the clock in the replica delay line 103A (refer to FIG. 4(a)).

As described above, in the clock phase adjustment circuits 201A and 201B connected to the clock wiring 100, on receipt of the forward clock CKg and the backward clock CKr which are transmitted through the clock wiring, the phase of the backward clock CKr is feedback-controlled according to the result of comparison between the phase of the backward clock CKr delayed in each circuit and the phase of the forward clock CKg from the clock wiring, thereby generating the internal clocks CLKA and CLKB each having the same phase as the phase of the clock passing the turn point T of the clock wiring 100. Therefore, regardless of the distances from the clock input end S to the respective clock phase adjustment circuits in the clock generation circuit, the respective clock phase adjustment circuits can output the internal clocks of the same phase.

Further, in the clock phase adjustment circuits 201A and 201B of this second embodiment, the backward clock CKr in the clock wiring 100 is delayed to generate the delayed internal clock, and the phase of the delayed internal clock is compared with the phase of the forward clock CKg in the clock wiring 100. Therefore, this second embodiment is effective when the distances from the turn point T of the clock wiring 100 to the first forward clock supply point Af and to the first backward clock supply point Ab are short.

More specifically, in the clock phase adjustment circuit 101A of the first embodiment, if the distances from the turn point T of the clock wiring 100 to the first forward clock supply point Af and to the first backward clock supply point Ab are short, there is a possibility that a delay time equivalent to the clock transmission time from the first forward clock supply point Af to the backward clock supply point Ab cannot be generated in the delay line 102A and the replica delay line 103A.

In contrast with this, in the clock phase adjustment circuit 201A of this second embodiment, a delay time to be generated by the delay line 102A and the replica delay line 103A is equivalent to a period of time from when the first pulse of clock passes the first forward clock supply point Ab to when the second pulse in the next cycle passes the clock supply point Af. Hence, even if the distances from the turn point T of the clock wiring 100 to the first forward clock supply point AF and to the first backward clock supply point Ab are short, a delay time required in the clock phase adjustment circuit 201A is not considerably shorter than one cycle of clock. In other words, according to this second embodiment, there is sufficient time to adjust the clock phase in the clock phase adjustment circuit 201A.

Further, when the clock wiring 100 in the clock generation circuit according to the first or second embodiment is shielded with a ground wiring, the distribution constant of the clock wiring 100 becomes uniform, whereby the precision of the internal clocks CLKA and CLKB can be improved.

While in this second embodiment the clock generation circuit includes two clock phase adjustment circuits, it may include three or more clock phase adjustment circuits.

Hereinafter, a description will be given of a clock generation circuit having three or more clock phase adjustment circuits, according to a modification of the second embodiment.

Figure 11:
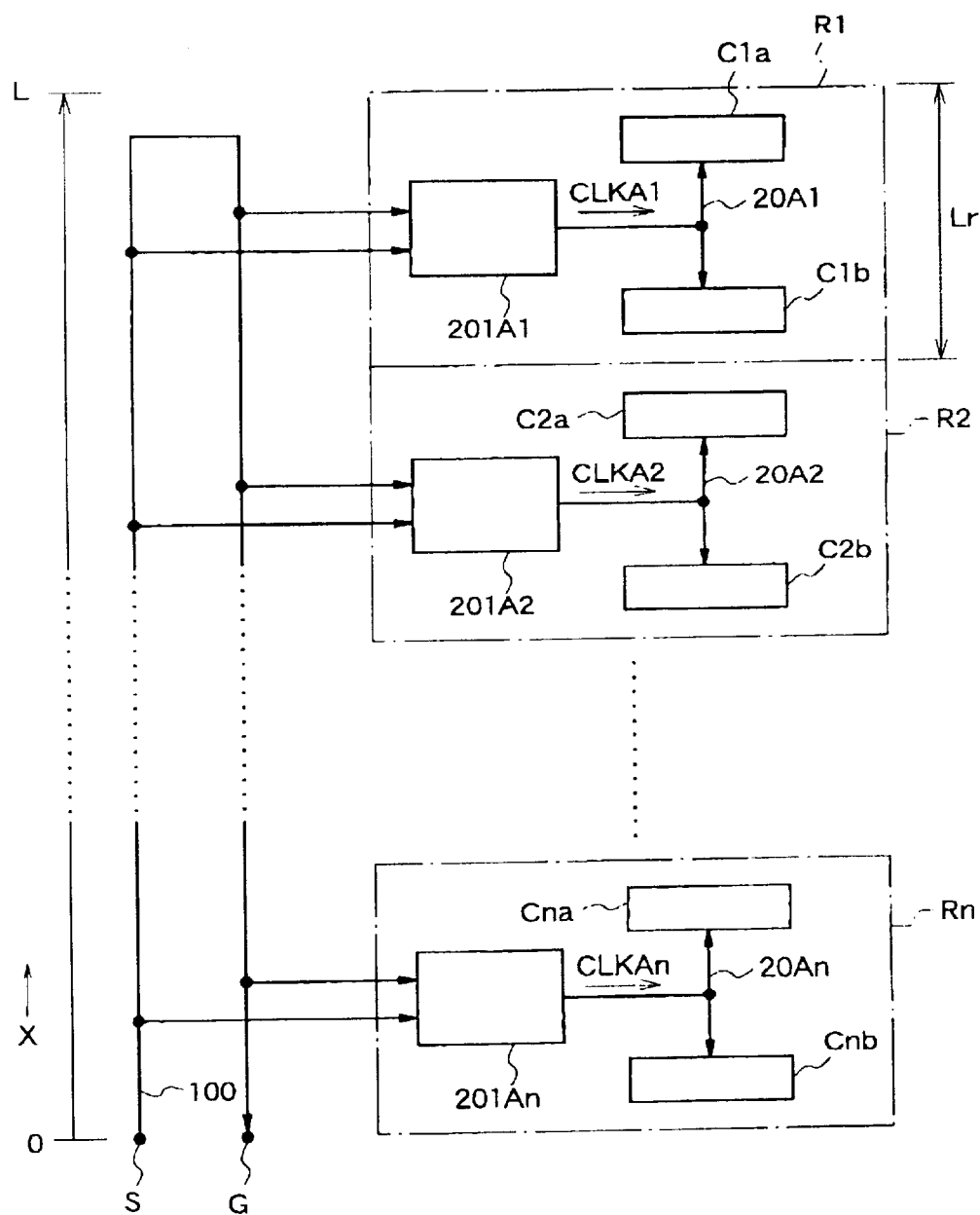
FIG. 11 is a schematic diagram for explaining the effect of a clock generation circuit according to a modification of the second embodiment.

FIG. 11 is a block diagram illustrating a clock generation circuit having pieces of clock phase adjustment circuits.

The clock generation circuit shown in FIG. 11 has n pieces of clock phase adjustment circuits 201A1, 201A2, . . . , 201An arranged at equal intervals along the clock wiring 100, and each clock phase adjustment circuit is disposed in the center of each of regions R1~Rn where internal clocks are output from the clock phase adjustment circuits.

In the clock generation circuit so constructed, skew of internal clock can be reduced to ½n as compared with the conventional clock generation circuit.

To be specific, n regions R1~Rn for supplying internal clocks are assigned to the clock phase adjustment circuits 201A1~201An, respectively, along the clock wiring 100. In the respective circuits 201A1~201An, circuits C1a~Cna and circuits C1b~Cnb to which the internal clocks from the corresponding clock phase adjustment circuits are applied, are arranged. Internal clocks CLKA1~CLKAn are supplied from the corresponding clock phase adjustment circuits 201A1~201An through internal clock lines 20A1~20An to the circuits C1a~Cna and C1b~Cnb, respectively.

Assuming that the distance from the clock input end S of the clock wiring 100 to the farthest circuit C1a in the longitudinal direction X of the wiring is L, the length of each region along the direction X is Lr, and the skew per unit length in the direction X is Su, the maximum skew So of internal clock in the conventional clock generation circuit is represented by $$So = Su \cdot L = Su \cdot Lr \cdot n \quad (1)$$

On the other hand, in the clock generation circuit of this second embodiment, the maximum skew S1 of internal clock is represented by $$S1 = Su \cdot Lr/2 \quad (2)$$

Accordingly, the ratio of the skew in the clock generation circuit of this second embodiment to the skew in the conventional clock generation circuit is represented by $$S1/So = (Su \cdot Lr/2)/(Su \cdot Lr \cdot n) \quad (3)$$

an therefore, $S1 = (\frac{1}{2}n) \cdot So$.

the effect of reducing the skew of the internal clock to ½n can be obtained in the clock generation circuit of the first embodiment by providing the clock generation circuit with n pieces of clock phase adjustment circuits.

Embodiment 3

Figure 5:
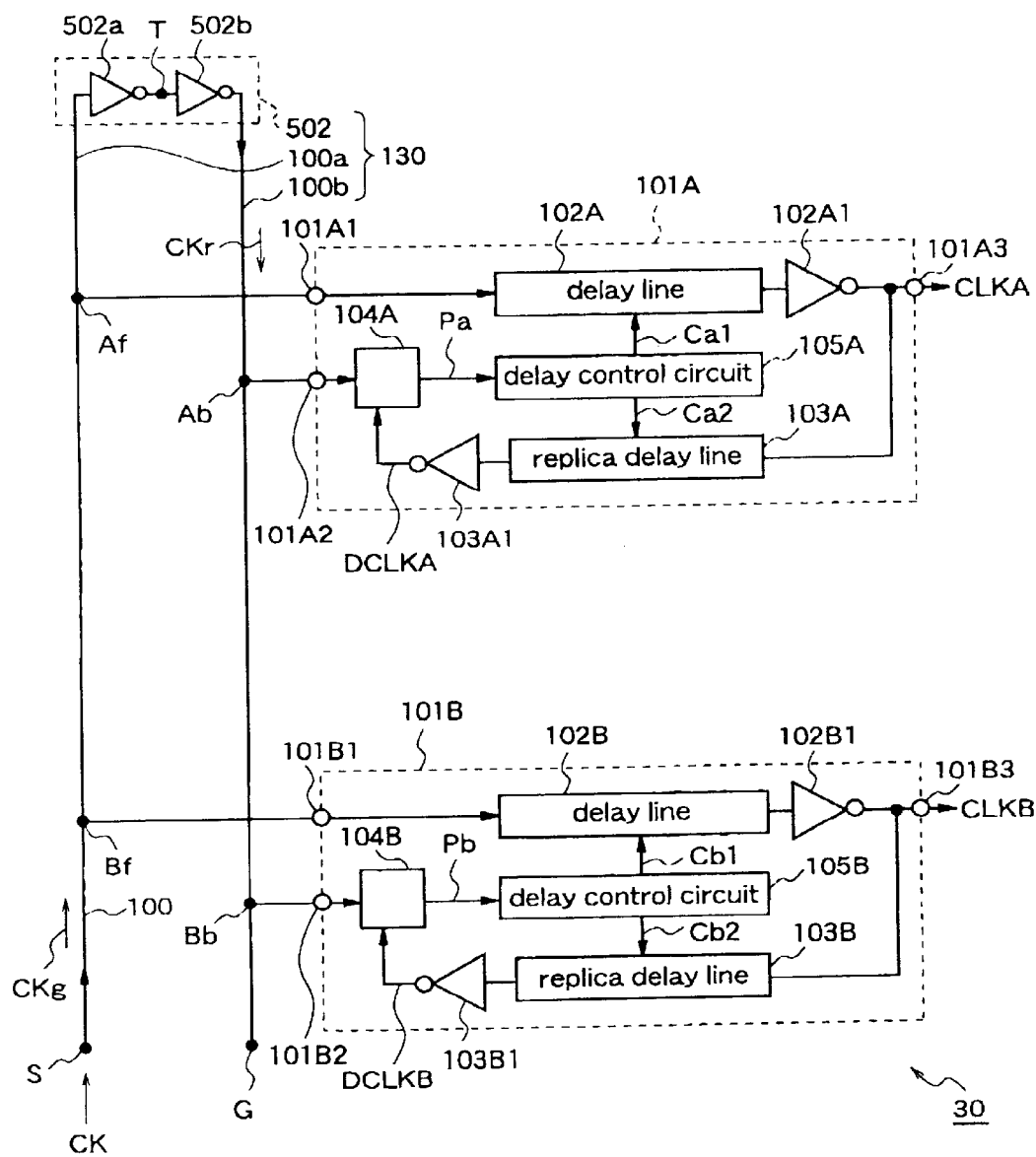
FIG. 5 is a block diagram for explaining a clock generation circuit according to a third embodiment of the present invention.

FIG. 5 is a block diagram for explaining a clock generation circuit 30 according to a third embodiment of the present invention. In FIG. 5, the same reference numerals as those of the clock generation circuit 10 according to the first embodiment designate the same or corresponding parts.

The clock generation circuit 30 of this third embodiment includes a clock wiring 130 having a return time adjustment circuit 502 which delays a clock by a quantity Ld, in place of the clock wiring 100 of the clock generation circuit 10 of the first embodiment.

The clock wiring 130 is obtained by inserting the return time adjustment circuit 502 in the turned portion of the clock wiring 100 of the first embodiment. Further, the return time adjustment circuit 502 comprises driver circuits 502a and 502b connected in series, and each driver circuit inverts an input signal and outputs the inverted signal. These driver circuits 502a and 502b have the same signal delay time, and a junction of these driver circuits corresponds to the turn point T of the clock wiring 130.

Other constituents of the clock generation circuit 30 are identical to those of the clock generation circuit 10 according to the first embodiment.

Next, the function and effect will be described.

Figure 6:
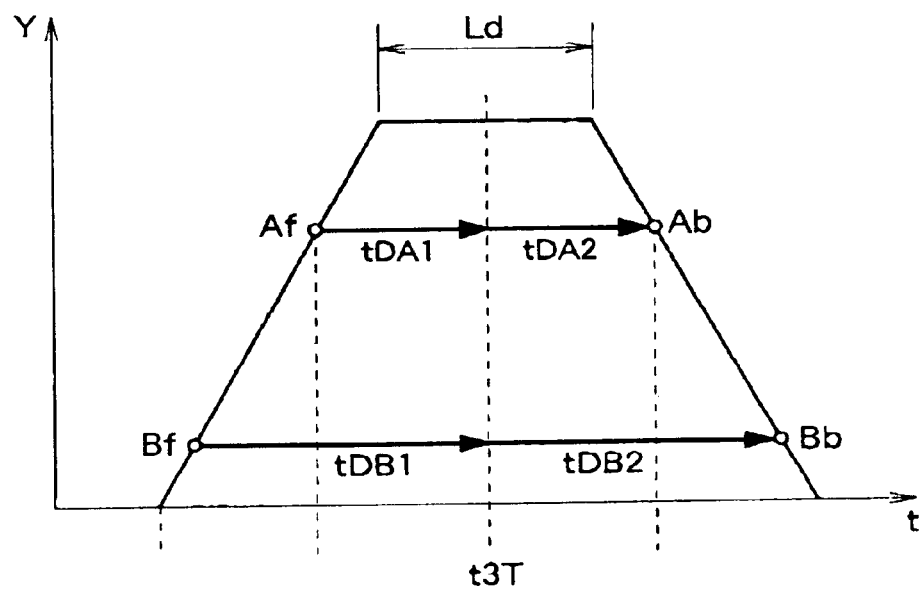
FIG. 6 is a graph for explaining the operation of the clock generation circuit according to the third embodiment.

FIG. 6 is a diagram for explaining the operation of the clock generation circuit 30 shown in FIG. 5. To be specific, FIG. 6 shows the relationship between the transmitted clock position Y on the clock wiring 130 and the elapsed time t after the clock is input to the clock input end S, on a two-dimensional coordinate plane in which the abscissa shows the time t and the ordinate shows the position Y.

When the transmitted clock position Y is represented as the distance from the clock input end S of the clock wiring 130 (reference point) to the position Y, the graph showing the relationship between the time and the position at which the clock rises on the clock wiring 130 is a diagram comprising two sides of an isosceles trapezoid and an upper side of the isosceles trapezoid between these two sides. Further, on the coordinate plane, time t3T at the intersection of the abscissa and the axis of symmetry of the isosceles trapezoid is the time when the clock rises at the turn point T (time when the clock passes the turn point T).

hereinafter, the operation of the clock generation circuit will be described.

Initially, when a clock CK is input to the clock input end S, it travels toward the return point T as a forward clock CKg. Then, the forward clock CKg is input to the return time adjustment circuit 502, wherein the clock CKg is delayed by a delay time Ld to be output. The clock output from the adjustment circuit 502 travels toward the clock wiring end G as a backward clock CKr.

At this time, the second clock phase adjustment circuit 101B adjusts the phase of the forward clock CKg supplied from the second forward clock supply point Bf by feedback control based on the backward clock supplied from the second backward clock supply point Bb, and the phase adjustment circuit 101B outputs an internal clock CLKB having the same phase as the phase of the clock passing the turn point T of the clock wiring 130.

Further, the first clock phase adjustment circuit 101A adjusts the phase of the forward clock supplied from the first forward clock supply point Af by feedback control based on the backward clock CKr supplied from the first backward clock supply point Ab, and the phase adjustment circuit 101A outputs an internal clock CLKA having the same phase as the phase of the clock passing the turn point T of the clock wiring 130.

The feedback control of the clock phase in each of the clock phase adjustment circuits 101A and 101B is performed in the same manner as described for the first embodiment.

In the clock generation circuit 30 of the third embodiment so constructed, in the state where the feedback control of the clock phase is performed in the clock phase adjustment circuits 101A and 101B (locked state), the phases of the internal clocks. CLKA and CLKB output from these adjustment circuits 101A and 101B become equal to the phase of the clock at the turn point T of the clock wiring 130, as in the first and second embodiments.

Further, in this third embodiment, the forward clock CKg and the backward clock CKr are delayed each by a quantity Ld/2 in the return time adjustment circuit 502 of the clock wiring 130. In other words, delays in the delay line 102A (103B) and the replica delay line 103A (103B) of the clock phase adjustment circuit 101A (101B) can be increased by Ld/2 as compared with those of the first and second embodiments.

As the result, even when the distance between the turn point T of the clock wiring and the first supply point Af of the forward clock CKg to the clock phase adjustment circuit 101A positioned near the turn point T of the clock wiring 130 is short, a clock delay time equivalent to this distance can be generated in the clock phase adjustment circuit 101A.

While in this third embodiment the clock generation circuit includes two clock phase adjustment circuits, it may include three or more clock phase adjustment circuits with the same effects as described for the third embodiment.

Embodiment 4

Figure 7:
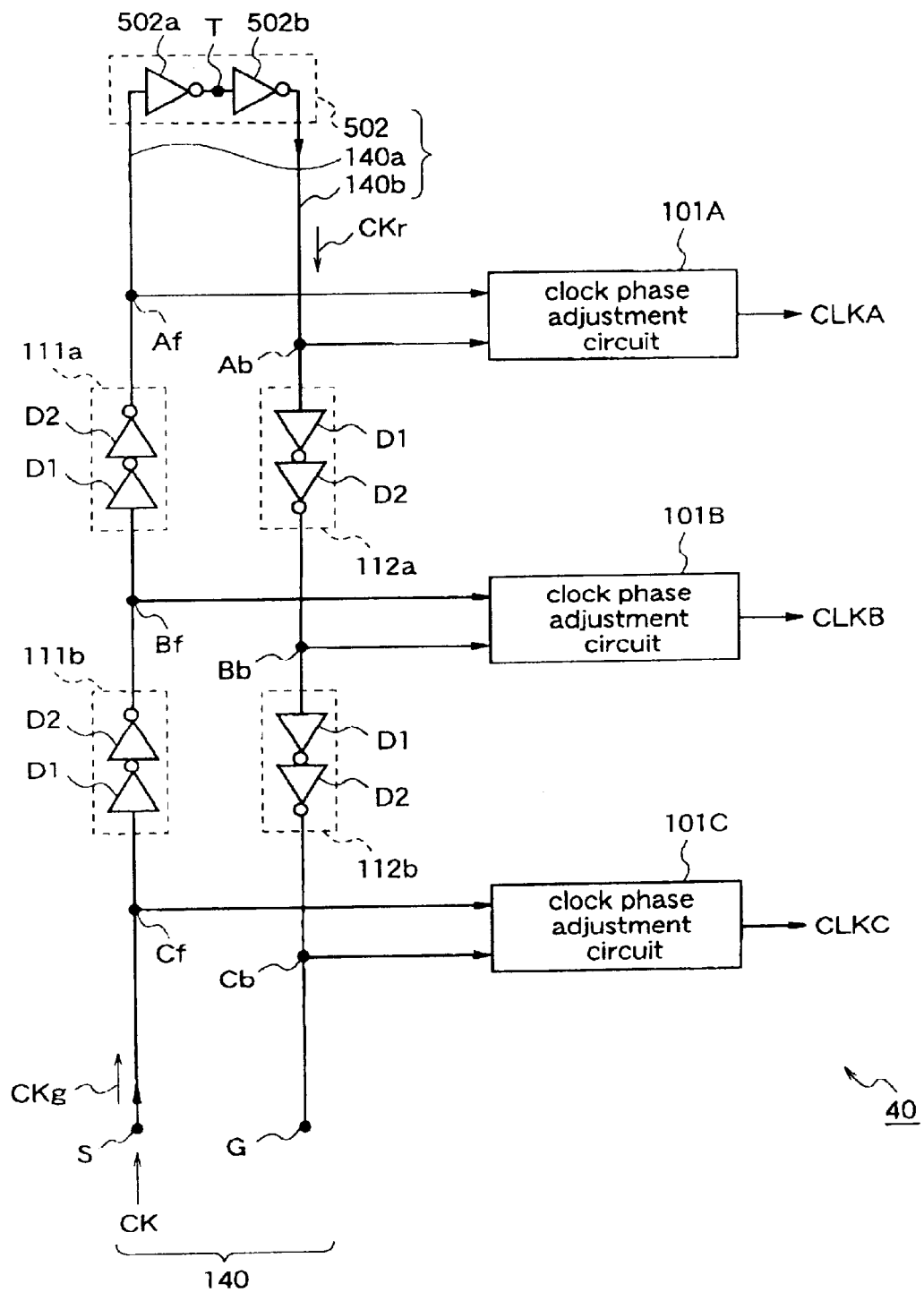
FIG. 7 is a block diagram for explaining a clock generation circuit according to a fourth embodiment of the present invention.

FIG. 7 is a block diagram for explaining a clock generation circuit 40 according to a fourth embodiment of the present invention. In FIG. 7, the same reference numerals as those shown in FIG. 5 designate the same or corresponding parts.

The clock generation circuit 40 includes a clock wiring 140 including a return time adjustment circuit 502 which delays a clock by a quantity Ld, in place of the clock wiring 100 of the clock generation circuit 10 of the first embodiment. Further, the clock generation circuit 40 includes a third clock phase adjustment circuit 101C in addition to the first and second clock phase adjustment circuits 101A and 101B. The first to third clock phase adjustment circuits 101A, 101B and 101C are arranged at equal intervals along the clock wiring 140.

That is, in the forward clock path 140a of the clock wiring 140, forward clock supply points Cf, Bf and Af for supplying the forward clock CKg to the respective clock phase adjustment circuits 101A, 101B and 101C are positioned in this order from the clock input end S to the turning point T.

Further, in the backward clock path 140b of the clock wiring 140, backward clock supply points Ab, Bb and Cb for supplying the backward clock CKr to the respective clock phase adjustment circuits 101A, 101B and 101C are positioned in this order from the turn point T to the clock wiring end G.

Further, a second forward waveform shaping circuit 111b is inserted between the adjacent forward clock supply points Bf and Cf of the forward clock path 140a of the clock wiring 140, while a first forward waveform shaping circuit 111a is inserted between the adjacent forward clock supply points Af and Bf of the forward clock path 140a. Moreover, a first backward waveform shaping circuit 112a is inserted between the adjacent backward clock supply points AB and Bb of the backward clock path 140b of the clock wiring 140, while a second backward waveform shaping circuit 112b is inserted between the adjacent backward clock supply points Bb and Cb of the backward clock path 140b.

Each of the waveform shaping circuits 111a, 111b, 112a and 112b comprises two driver circuits D1 and D2 connected in series, and the respective waveform shaping circuits have equal driving abilities. Further, the clock input end S, the forward clock supply point Cf, the forward clock supply point Bf, the forward clock supply point Af, the return time adjustment circuit 502, the backward clock supply point Ab, the backward clock supply point Bb, the backward clock supply point Cb, and the clock wiring end G are placed at equal intervals, and so the clock transmission times between the respective points are equal.

Further, the third clock phase adjustment circuit 101C has the same circuit structure as the first clock phase adjustment circuit 101A, i.e., it is composed of elements corresponding to the delay line 102A, the driver circuit 102A1, the replica delay line 103, the driver circuit 103A1, the phase comparator 104A and the delay control circuit 105A.

Next, the function and effect will be described.

Figure 8:
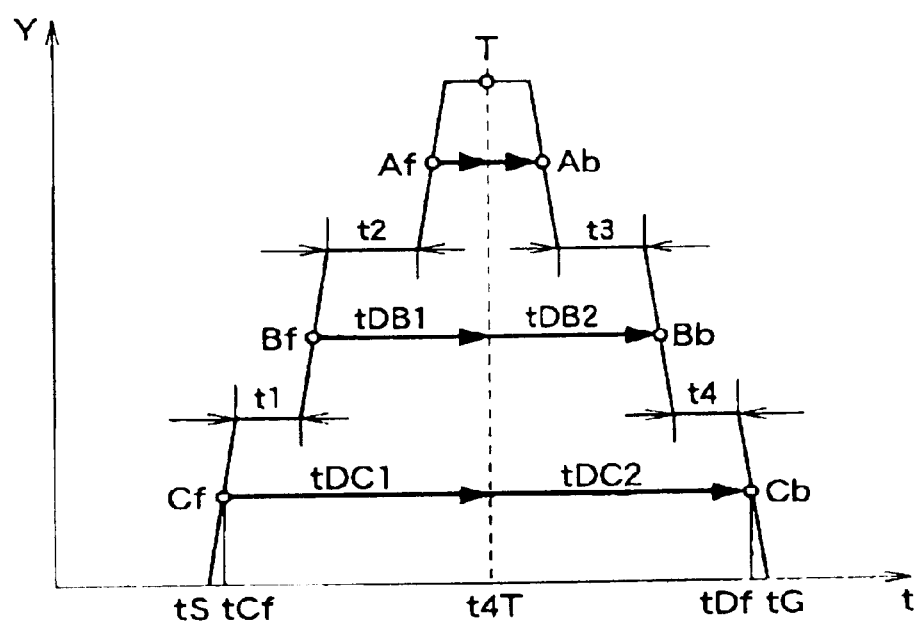
FIG. 8 is a graph for explaining the operation of the clock generation circuit according to the fourth embodiment.

FIG. 8 is a diagram for explaining the operation of the clock generation circuit 40 shown in FIG. 7. To be specific, FIG. 8 shows the relationship between the transmitted clock position Y on the clock wiring 140 and the elapsed time t after the clock is applied to the clock input end S, on a two-dimensional coordinate plane in which the abscissa shows the time t and the ordinate shows the position Y.

When the clock position Y is represented as the distance from the clock input end S of the clock wiring 130 (reference point) to the position Y, the graph showing the relationship between the time and the position at which the clock rises on the clock wiring 130 is shaped like symmetric steps with a straight line parallel to the ordinate Y in the center of the symmetry, as shown in FIG. 8. Further, on the coordinate plane, time t4T at the intersection of the abscissa and the axis of symmetry of the graph is the time when the clock raises at the turn point T (time when the clock passes the turn point T).

Hereinafter, the operation of the clock generation circuit will be described.

When a clock CK is input to the clock input end S at time tS, it travels through the forward clock path 140a of the clock wiring 140 as a forward clock CKg. At time tCf, the forward clock CKg passes the forward clock supply point Cf to reach the second forward waveform shaping circuit 111b.

In the second forward waveform shaping circuit 111b, the forward clock CKg is delayed by a predetermined time t1 to be output. Assuming that the physical length of the waveform shaping circuit is sufficiently shorter than the length of the clock wiring, the graph on the coordinate plane shown in FIG. 8 shows the state where only the time goes by while the position of the forward clock CKg does not change.

Thereafter, the forward clock CKg output from the second forward waveform shaping circuit 111b passes the forward clock supply point Bf to reach the first forward waveform shaping circuit 111a, wherein it is delayed by a predetermined time t2. The delayed forward clock CKg passe the forward clock supply point Af to reach the return time adjustment circuit 502.

In the return time adjustment circuit 502, the forward clock CKg is delayed by the above-mentioned delay time Ld to be output.

The clock output from the adjustment circuit 502 is transmitted as a backward clock CKr, through the backward clock supply point Ab, the first forward waveform shaping circuit 112a, the backward clock supply point Bb, the second backward waveform shaping circuit 112b, and the backward clock supply point Cb, and reaches the clock wiring end G at time tG.

Meanwhile, the backward clock CKr is delayed by predetermined times t3 and t4 in the first and second backward waveform shaping circuits 112a and 112b, respectively.

In this fourth embodiment, the delay time t1 in the second forward waveform shaping circuit 111b is equal to the delay time t4 in the second backward waveform shaping circuit 112b, and the delay time t2 in the first forward waveform shaping circuit 111a is equal to the delay time t3 in the first backward waveform shaping circuit 112a. Therefore, on the coordinate plane, the graph showing the transmitted clock position and the elapsed time becomes symmetric with respect to the straight line which is parallel to the ordinate Y and passes the point indicating time t4T at which the input clock passes the turn point T.

In other words, "going" times required for transmitting the forward clock CKg from the clock supply points Af, Bf and Cf corresponding to the clock phase adjustment circuits 101A, 101B and 101C to the clock wiring turn point T are equal to "return" times required for transmitting the backward clock CKr from the turn point T to the clock supply points Ab, Bb and Cb.

Thereby, in each clock phase adjustment circuit, feedback control for the forward clock CKg supplied from the corresponding forward clock supply point is performed according to the backward clock CKr supplied from the corresponding backward clock supply point.

To be specific, in each clock phase adjustment circuit, the forward clock CKg supplied from the corresponding forward clock supply point is delayed by the above-described "going" time in the delay line to be output as an internal clock, and the internal clock is delayed by the above-described "return" time in the replica delay line to be output as a delayed internal clock. Then, the phase of the delayed internal clock is compared with the phase of the backward clock CKr supplied from the backward clock supply point, whereby the phase of the internal clock is feedback-controlled.

According to the fourth embodiment so constructed, in the clock wiring according to the third embodiment, a forward waveform shaping circuit is inserted between adjacent forward clock supply points while a backward waveform shaping circuit is inserted between adjacent backward clock supply points. Therefore, even when the clock wiring is long, the waveform can be prevented from rounding by making the rising edge of the forward clock CKg steep, whereby the precision of the internal clock obtained by delaying the forward clock CKg can be improved.

While in this fourth embodiment the clock generation circuit includes two waveform shaping circuits in each of the forward clock path and the backward clock path of the clock wiring, the number of the waveform shaping circuits so disposed is not restricted two, that is, three or more waveform shaping circuits may be disposed. Also in this case, the same effects as described for the fourth embodiment are achieved.

In this case, the delay in the forward waveform shaping circuit corresponding to two adjacent clock phase adjustment circuits must be equal to the delay in the backward waveform shaping circuit corresponding to the two adjacent clock phase adjustment circuits.

Further, in this fourth embodiment, the clock input end S, the forward clock supply point Cf, the forward clock supply point Bf, the forward clock supply point Af, the return time adjustment circuit 502, the backward clock supply point Ab, the backward clock supply point Bb, the backward clock supply point Cb, and the clock wiring end G are placed at equal intervals and so the clock transmission times between the respective points are equal. However, the present invention is not restricted thereto.

That is, the distances and the clock transmission times between the respective points mentioned above is decided so that at least the graph showing the relationship between the transmitted clock position Y on the clock wiring 140 and the elapsed time t after the clock is applied to the clock input end S is symmetric with respect to a straight line parallel to the ordinate of the coordinate plane as shown in FIG. 8.

Further, while in this fourth embodiment the clock generation circuit includes three clock phase adjustment circuits placed along the clock wiring, the number of the clock phase adjustment circuits may be two or more than three.

Embodiment 5

Figure 9:
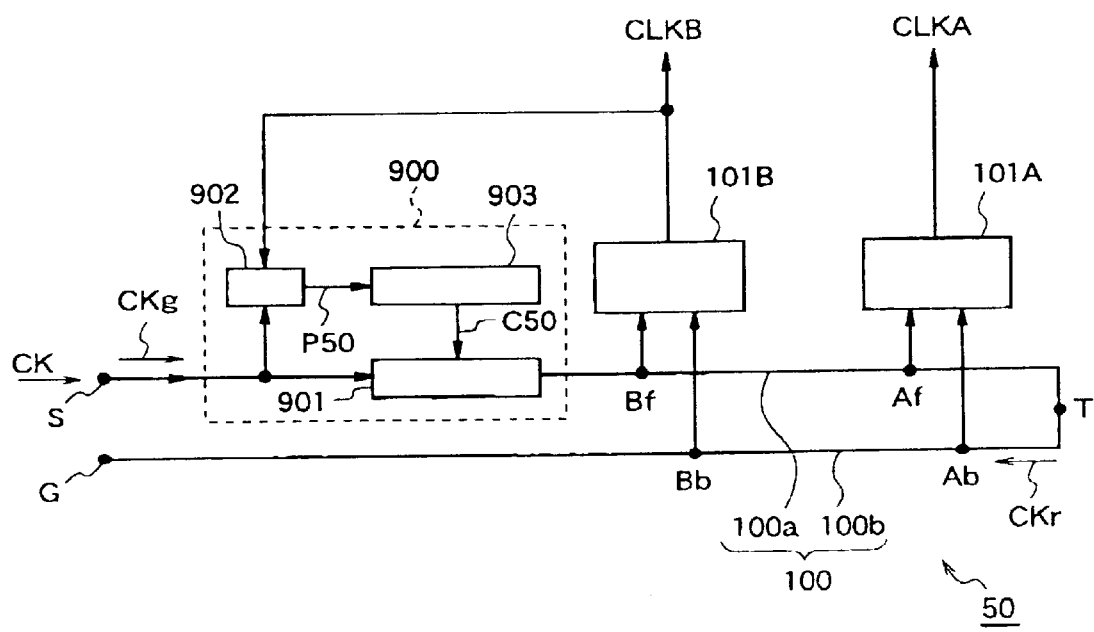
FIG. 9 is a block diagram for explaining a clock generation circuit according to a fifth embodiment.

FIG. 9 is a block diagram for explaining a clock generation circuit 50 according to a fifth embodiment of the present invention.

The clock generation circuit 50 of this fifth embodiment includes, in addition to the constituents of the clock generation circuit 10 of the first embodiment, a reference clock delay circuit 900 for delaying the forward clock CKg, disposed between the clock input end S and the second forward clock supply point Bf of the clock wiring 100.

The reference clock delay circuit 900 comprises a delay line 901, a phase comparator 902, and a delay control circuit 903. The delay line 901 is inserted between the clock input terminal 3 and the second forward clock supply point Bf, and a delay in the delay line 901 is set according to a control signal C50. The phase comparator 902 compares the phase of the internal clock CLKB output from the clock phase adjustment circuit 101B with the phase of the forward clock CKg transmitted from the clock input end S to the turn point T, and outputs a phase comparison signal P50 according to the result of the comparison. The delay control circuit 903 outputs the control signal C50 to the delay line 901 according to the phase comparison signal P50 output from the phase comparator 902.

A description will be given of the function and effect.

When the clock CK is input to the clock input end S, it travels as a forward clock CKg from the input end S to the turn point T. When the forward clock CKg reaches the reference clock delay circuit 900, it is delayed by a predetermined time to be output. When the forward clock CKg output from the delay circuit 900 reaches the turn point T, it travels, as a backward clock CKr from the turn point T through the backward clock path 100b of the clock wiring toward the clock wiring end G.

In the second clock phase adjustment circuit 101B, the phase of the forward clock CKg from the second forward clock supply point Bf of the clock wiring 100 is feedback-controlled according to the backward clock CKr from the second backward clock supply point Bb of the clock wiring 100, and an internal clock CLKB having the same phase as the phase of the clock at the turn point T of the block wiring 100 is output.

Further, in the first clock phase adjustment circuit 101A, the phase of the forward clock CKg from the first forward clock supply point Af of the clock wiring 100 is feedback-controlled according to the backward clock CKr from the first backward clock supply point Ab of the clock wiring 100, and an internal clock CLKA having the same phase as the phase of the clock at the turn point T of the clock wiring 100 is output.

Further, the internal clock CLKB output from the second clock phase adjustment circuit 101B is input to the reference clock delay circuit 900. In the delay circuit 900, the phase comparator 902 compares the phase of the internal clock CLKB with the phase of the forward clock CKg from the clock input end S, and outputs a phase comparison signal P50 according to the result of the comparison to the delay control circuit 903.

Then, the delay control circuit 903 outputs a delay control signal C50 according to the phase comparison signal P50 to the delay line 901. In the delay line 901, according to the delay control signal C50, a delay is set so that the phase of the forward clock CKg from the clock input end S matches the phase of the internal clock CLKB.

Thereby, the internal clocks CLKA and CLKB having the same phase as the phase of the output of the clock generation circuit are output from the clock phase adjustment circuits 101A and 101B, respectively.

As described above, the clock generation circuit 50 of this fifth embodiment includes the reference clock delay circuit 900 disposed in the vicinity of the input end S of the clock wiring 100, in addition to the constituents of the clock generation circuit 10 of the first embodiment. The reference clock delay circuit 900 performs feedback control on the delay of the clock CKg from the clock input end S in accordance with the internal clock CLKB from the second clock phase adjustment circuit 101B so that the phase of the internal clock CLKB matches the phase of the forward clock CKg. Therefore, it is possible to match the phases of the internal clocks CLKA and CLKB output from the clock phase adjustment circuits 101A and 101B with the phase of the clock CK from the outside.

In the clock generation circuit 50 of this fifth embodiment, the phase comparator 902 as a constituent of the reference clock delay circuit 900 is positioned in the vicinity of the input end S of the clock wiring 100. However, the position of the phase comparator 902 is not restricted thereto. For example, as long as the delay time in the path for feeding the internal clock CLKB back to the phase comparator 902 is negligible as compared with the delay time in the delay lien 901 of the reference clock delay circuit 900, the phase comparator 902 may be disposed in any position other than the position in the vicinity of the clock input end S.

Further, an internal clock having various phases can be generated by disposing a delay lien between the clock input end S and the reference clock delay circuit 900.

For example, when a delay line having a delay equivalent to 7π/4 with respect to the cycle of the clock CK is disposed between the clock input end S and the clock phase adjustment circuit 900, the phase of the internal clock CLKB output from the clock phase adjustment circuit 101B leads the phase of the clock CK by 7π/4, i.e., delays by π/4.

In this case, since the internal clocks CLKA and CLKB have the same phase, if the phase of the internal clock CLKB delays by π/4 from the phase of the clock CK, the internal clock CLKA also delays by π/4 from the phase of the clock CK.

While in this fifth embodiment the clock generation circuit has two clock phase adjustment circuits, it may have three or more clock phase adjustment circuits.

Embodiment 6

Figure 10:
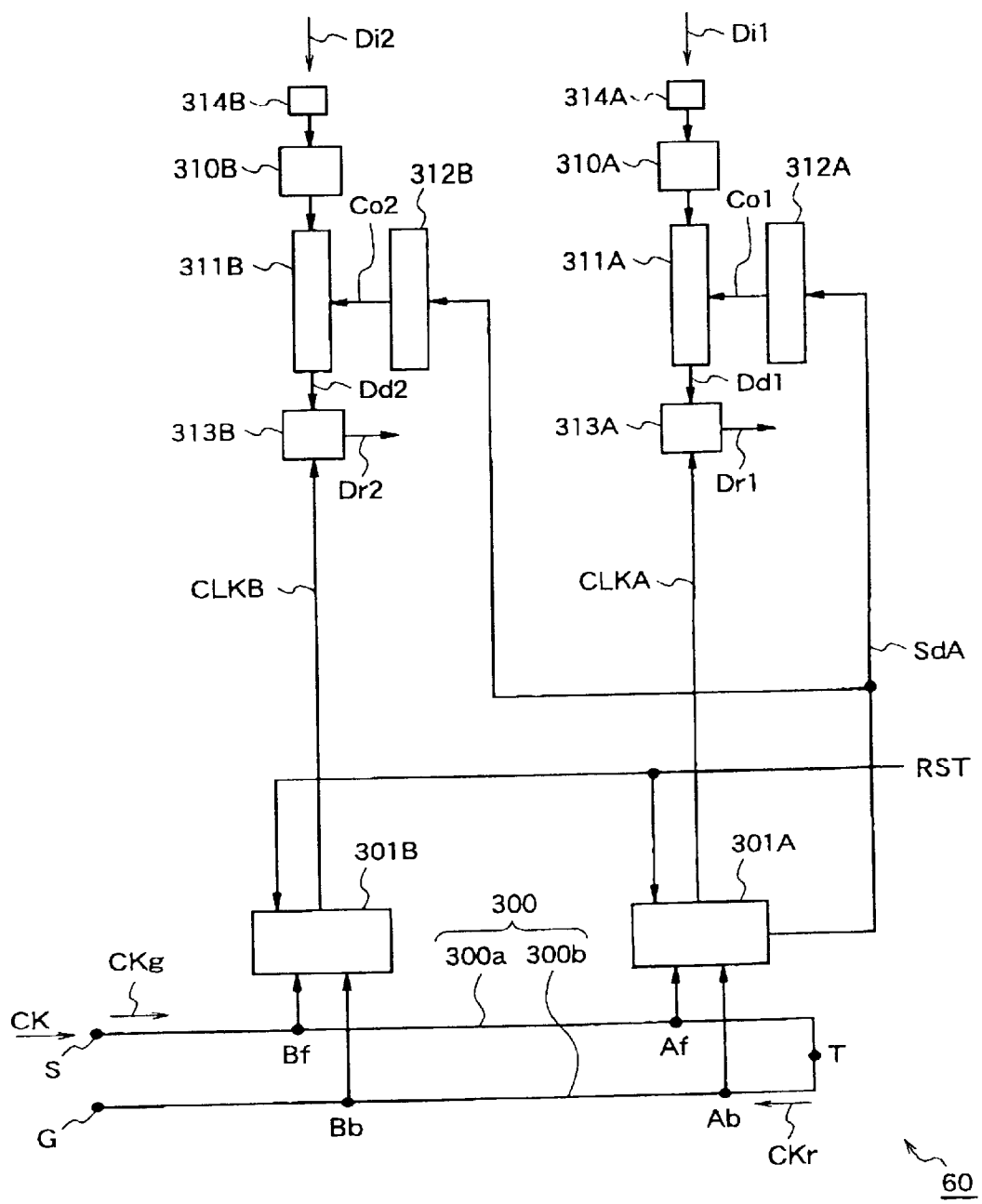
FIG. 10 is a block diagram for explaining a semiconductor integrated circuit according to a sixth embodiment.

FIG. 10 is a block diagram for explaining a semiconductor integrated circuit 60 according to a sixth embodiment of the present invention.

The semiconductor integrated circuit 60 includes a bent clock wiring 300 in which a clock CK supplied from the outside is transmitted, and first and second clock phase adjustment circuits 301A and 301B which output phase-controlled internal clocks CLKA and CLKB according to the clock transmitted in the clock wiring 300.

The clock wiring 300 is composed of a forward clock path 300a in which the clock CK supplied from the outside to the input end S travels as a forward clock CKg toward the turn point T, and a backward clock path 300b in which the clock which has passed the turn point T travels as a backward clock CKr toward the clock wiring end G. In the forward clock path 300a, second and first forward clock supply points Bf and Af for supplying the forward clock CKg to the second and first clock phase adjustment circuits 301B and 301A, respectively, are placed in this order from the clock input end S. In the backward clock path 300b, first and second backward clock supply points Ab and Bb for supplying the backward clock CKr to the first and second clock phase adjustment circuits 301A and 301B are placed in this order from the turn point T.

Further, each of the first and second clock phase adjustment circuits 301A and 301B has reset function, in addition to the constituents of the clock phase adjustment circuit according to the first embodiment, and it performs feedback control on the phase of the forward clock CKg, for a predetermined period of time, in accordance with a reset signal RST from the outside.

To be specific, each of the clock phase adjustment circuits 301A and 301B comprises a delay line for delaying the forward clock CKg, a driver circuit on the output side of the delay line, a replica delay line for delaying the output of the driver circuit, a driver circuit on the output side of the replica delay line, a phase comparator for comparing the phase of the output clock with the phase of the backward clock CKr, and a delay control circuit for controlling delays in the delay line and the replica delay line in accordance with the result of the phase comparison. The delay control circuit receives the reset signal RST and outputs a delay control signal to the delay line and the replica delay line for a predetermined period of time in accordance with the reset signal RST. Further, when input of the delay control signal is stopped, each of the delay line and the replica delay line holds the delay at this point of time. Further, the first clock phase adjustment circuit 301A outputs the delay control signal supplied from the delay control circuit, as delay information SdA which indicates how mach the internal clock CLKA is delayed from the forward clock CKg supplied from the first forward clock supply point Af.

The semiconductor integrated circuit 60 comprises first and second input buffers 310A and 310B which hold input data Di1 and Di2 input to input pads 314A and 314B, respectively, and input data delay lines 311A and 311B which receive the input data Di1 and Di2 output from the input buffers and output delayed input data Dd1 and Dd2 obtained by delaying the input data Di1 and Di2 according to control signals Co1 and Co2, respectively. Each of the input data delay lines has delay characteristics to temperature equal to delay characteristics to temperature of the delay line and the replica delay line in the clock phase adjustment circuit 301A.

Further, the semiconductor integrated circuit 60 includes delay control circuits 312A and 312B which control the input data delay lies 311A and 311B by the control signal Co1 and Co2 in accordance with the delay information SdA from the clock phase adjustment circuit 301A so that the delay time of each delay line becomes equal to the delay time of the internal clock in the delay line of the clock phase adjustment circuit 301A. The semiconductor integrated circuit 60 further includes latch circuits 313A and 313B which latch the delayed input data Dd1 and Dd2 output from the input data delay lines 311A and 311B in accordance with the internal clocks CLKA and CLKB from the first and second clock phase adjustment circuits 301A and 301B, respectively, to output latched input data Dr1 and Dr2.

In the semiconductor integrated circuit 60, the clock generation circuit is composed of the bent clock wiring 300, and the first and second clock phase adjustment circuits 301A and 301B.

Next, the function and effect will be described.

The semiconductor integrated circuit 60 having the clock generation circuit so constructed is effective in a system where phase matching of clocks is performed only in a predetermined period of time such as a setup time.

Further, in the semiconductor integrated circuit 60, even when the delay in the clock generation circuit changes due to temperature change during a period other than the setup time, since the relative phase difference between the internal clock CLKA (CLKB) output from the clock generation circuit and the delayed input data Dd1 (Dd2) is kept constant, the latch circuit 313A (313B) can reliably latch the data supplied from the outside.

Hereinafter, the operation of the semiconductor integrated circuit 60 will be described.

Initially, when the system including the semiconductor integrated circuit 60 starts to operate, an external clock CK and a reset signal RST are input to the clock generation circuit. Further, input data Di1 and Di2 are applied to the first and second pads 314A and 314B of the semiconductor integrated circuit 60.

During the setup time of this system immediately after starting the operation, the reset signal RST is active and, therefore, the forward clock DKg supplied from the clock wiring 300 is delayed in the delay line in each of the clock phase adjustment circuits 301A and 301B, and the delay in the delay line is feedback-controlled, thereby outputting internal clocks CLKA and CLKB having the same phase as the phase of the clock at the turn point T of the clock wiring 300. At this time, the delay control signal from the first clock phase adjustment circuit 301A is applied as delay information SdA to the delay control circuits 312A and 312B for controlling the delays of the input data delay lines 311A and 311B, and the delays of the input data delay lines 311A and 311B are controlled by the control signals Co1 and Co2 from the delay control circuits 312A and 312B.

On the other hand, the input data Di1 and Di2 applied to the first and second pads 314A and 314B are supplied through the buffer 310A and 310B to the input data delay lines 311A and 311B, respectively, wherein the input data Di1 and Di2 are delayed by a predetermined period of time to be output as delayed input data Dd1 and Dd2 to the first and second latch circuits 313A and 313B, respectively.

In the respective latch circuits 313A and 313B, the delayed input data Dd1 and Dd2 are latched in accordance with the internal clocks CLKA and CLKB output from the first and second clock phase adjustment circuits 301A and 301B, respectively. Then, the delayed input data latched by the latch circuits (latched data) Dr1 and Dr2 are output at timings according to the cycles of the internal clocks CLKA and CLKB, respectively.

In this case, since the delays in the delay lines in the clock phase adjustment circuits 301A and 301B are feedback-controlled so that the phases of the internal clocks CLKA and CLKB match the phase of the clock at the turn point T of the clock wiring 300, the delays in the delay lines of the clock phase adjustment circuits 301A and 301B are kept constant even when the temperature varies. Further, the change in delay due to the feedback control is supplied, as delay information SdA, from the first clock phase adjustment circuit 301A to the delay control circuits 312A and 312B for controlling the input data delay lines 311A and 311B. So, the delays in the input data delay lines 311A and 311B are kept constant regardless of temperature change.

As the result, in the latch circuits 313A and 313B, the input data from the input data delay lines can be reliably latched in accordance with the internal clocks CLKA and CLKB even when the temperature changes.

When the setup time is over and the reset signal RST becomes inactive, control of delay in the delay line is stopped in each of the clock phase adjustment circuits 301A and 301B, and the delay in the delay line is fixed to the value at the time when the reset signal RST becomes inactive. At this time, control of delay in each of the input data delay lines 311A and 311B is also stopped, and the delay is fixed to the value at the time when the reset signal RST becomes inactive.

In this sixth embodiment, even if the temperature varies after the setup time has ended, the relative phase difference between the internal clock CLKA input to the latch circuit 313A and the delayed input data Dd1 from the input data delay line 311A is kept constant.

To be specific, the delay line in the clock phase adjustment circuit 301A and the input data delay line 311A have the same delay characteristics to temperature, and these delay lines have the same delay when the reset signal RST becomes inactive. Therefore, the input data output from the input buffer 310A is delayed by the delay of the internal clock with respect to the forward clock CKg supplied from the clock wiring. As the result, it is avoided that the relative phase difference between the internal clock CLKA from the clock phase adjustment circuit 301A and the delayed input data Dd1 from the input data delay line 311A is changed due to temperature change.

Although the delay line in the clock phase adjustment circuit 301B and the input data delay line 311B have the same delay characteristics to temperature, the delay in the delay line in the clock phase adjustment circuit 301B is larger than the delay in the input data delay line 311B. That is, the delay in the delay line in the clock phase adjustment circuit 301B is equal to the time required for transmitting the forward clock Ckg from the second forward clock supply point Bf to the turn point T, while the delay in the input data delay line 311B is equal to the time required for transmitting the forward clock CKg from the first forward clock supply point Af to the turn point T (i.e., the delay in the input data delay line 311A).

Therefore, although the change in delay in the delay line of the clock phase adjustment circuit 301B due to temperature change (change in phase of the internal clock CLKB due to temperature change) cannot be completely matched with the change in delay in the input data delay line 311 due to temperature change (change in phase of the delayed input data Dd2 due to temperature change), the amount of change (due to temperature change) in the delay time of the forward clock CKg in the clock phase adjustment circuit 301B can be reduced as compared with the amount of change (due to temperature change) in the delay time of the input data Di2 in the input data delay line 311B. As the result, the range of temperature change in which the latch circuit 313B an correctly latch the input data Dd2 according to the internal clock CLKB, can be increased.

In the system having the semiconductor integrated circuit 60 according to the sixth embodiment, the reset signals RST becomes active only in the setup time immediately after starting the operation of the system. However, this sixth embodiment may be applied to a system wherein the reset signal RST becomes active outside the setup time. Also in this case, the same effects as described above are achieved.

Further, in the semiconductor integrated circuit 60 according to the sixth embodiment, variations in clock delays in the delay lines, the replica delay lines, and the input data delay lines are caused by temperature change. However, this sixth embodiment may be applied to a semiconductor integrated circuit wherein variations in delay times in the above-described delay lines are caused by factors other than temperature change. Also in this case, adverse effects of the variations in the delay times in the delay lines on the operation of the latch circuits can be reduced.

Further, in the semiconductor integrated circuit according to the sixth embodiment, the delay characteristics of the input data delay lines are identical to the delay characteristics of the delay lines and the replica delay lines, and the delays in the input data delay lines are equal to the delays in the delay line and the replica delay line of the clock phase adjustment circuit closer to the turn point T of the clock wiring 300 than the other clock phase adjustment circuit. However, the delay characteristics and the delay quantities in the input data delay lines are not restricted to those of the sixth embodiment.

For example, as long as the relative phase difference between the internal clock input to the latch circuit and the input data is maintained even when the temperature changes in the state where the phase of the internal clock generated in the clock generation circuit is not adjusted by feedback control, the input data delay line may have any delay characteristic and any delay quantity.

What is claimed is:

1. A clock generation circuit comprising a clock wiring having opposed first and second ends, through which a clock is transmitted from the first end to the second end, and a plurality of clock phase adjustment circuits for generating internal clocks in accordance with the clock supplied from the clock wiring, each of said clock phase adjustment circuits comprising:
   a first-end side terminal and a second-end side terminal which are connected to first-end side point and a second-end side point of the circuit, respectively, said points being positioned on both sides of a reference point of the clock wiring;
   delay means for delaying a clock supplied from one of the terminals, and outputting an internal clock; and
   delay control means for performing feedback control on a delay of the clock in the delay means in accordance with the phase of the clock supplied from the other terminal so that the phase of the internal clock matches the phase of the clock at the reference point of the clock wiring.

2. The clock generation circuit of claim 1 wherein:
   said clock wiring is turned down at the reference point such that a portion of the wiring from the first end to the reference point and a portion of the wiring from the reference point to the second end are positioned in parallel with each other; and
   the distance from the first-end side point to the reference point of the clock wiring corresponding to each clock phase adjustment circuit is equal to the distance from the second-end side point to the reference point of the clock wiring corresponding to each clock phase adjustment circuit.

3. The clock generation circuit of claim 2 wherein:
   said delay means delays the clock input to the first-end side terminal of the clock phase adjustment circuit to output the internal clock; and
   said delay control means performs feedback control on a delay of the clock in the delay means in accordance with the phase of the clock input to the second-end side terminal of the clock phase adjustment circuit so that the phase of the internal clock matches the phase of the clock at the reference point of the clock wiring.

4. The clock generation circuit of claim 3 wherein said clock phase adjustment circuit further comprises:
   additional delay means for delaying the internal clock output from the delay means, and outputting the delayed internal clock;
   phase comparison means for comparing the phase of the delayed internal clock with the phase of the clock input to the second-end side terminal of the clock phase adjustment circuit, and outputting a phase comparison signal indicating the result of the comparison; and
   said delay control circuit performing feedback control in accordance with the phase comparison signal so that the delay in the delay means becomes equal to the delay in the additional delay means, and the phase of the internal clock matches the phase of the clock at the reference point of the clock wiring.

5. The clock generation circuit of claim 2 wherein:
   said delay means delays the clock input to the second-end side terminal of the clock phase adjustment circuit and outputs the internal clock; and
   said delay control means performs feedback control on a delay of the clock in the delay means in accordance with the phase of the clock input to the first-end side terminal of the clock phase adjustment circuit so that the phase of the internal clock matches the phase of the clock at the reference point of the clock wiring.

6. The clock generation circuit of claim 5 wherein said clock phase adjustment circuit further comprises:
   additional delay means for delaying the internal clock output from the delay means and outputting the delayed internal clock;
   phase comparison means for comparing the phase of the delayed internal clock with the phase of the clock input to the first-end side terminal of the clock phase adjustment circuit, and outputting a phase comparison signal indicating the result of the comparison; and
   said delay control circuit performing feedback control in accordance with the phase comparison signal so that the delay in the delay means becomes equal to the delay in the additional delay means, and the phase of the internal clock matches the phase of the clock at the reference point of the clock wiring.

7. The clock generation circuit of claim 2 further comprising clock delay means inserted in the turn point of the clock wiring, for delaying the clock transmitted in the clock wiring by a predetermined period of time.

8. The clock generation circuit of claim 2 further comprising:
   first waveform shaping circuit inserted between adjacent first-end side points of the clock wiring, for performing waveform shaping on the clock transmitted in the clock wiring; and
   a second waveform shaping circuit inserted between adjacent second-end side points of the clock wiring, for performing waveform shaping on the clock transmitted in the clock wiring;
   wherein a clock delay time in the first waveform shaping circuit positioned between a first-end side point corresponding to one of two adjacent clock phase adjustment circuits and a first-end side point corresponding to the other clock phase adjustment circuit is equal to a clock delay time in the second waveform shaping circuit positioned between a second-end side point corresponding to one of said two adjacent clock phase adjustment circuits and a second-end side point corresponding to the other clock phase adjustment circuit.

9. The clock generation circuit of claim 1 further comprising reference clock delay means disposed on the clock wiring, for delaying the clock transmitted in the clock wiring so that the phase of an internal clock output from a specific one of the plural clock phase adjustment circuits becomes equal to the phase of the clock input to the first end of the clock wiring.

10. The clock generation circuit of claim 1 further comprising:

reference clock delay means disposed on the clock wiring, for delaying the clock transmitted in the clock wiring; and predetermined-time delay means disposed between the first end of the clock wiring and the reference clock delay means, for delaying the clock input to the first end of the clock wiring by a predetermined period of time;

wherein the phase of the internal clock output from a specific one of the plural clock phase adjustment circuits is equal to the phase of the input clock delayed by the predetermined time.

11. The clock generation circuit of claim 1 wherein each of the clock phase adjustment circuits performs feedback control on a delay in the delay means by using the delay control means, for a predetermined period of time, in accordance with a control signal supplied from the outside.

12. A semiconductor integrated circuit comprising a clock generation circuit for generating an internal clock according to a clock supplied from the outside, a buffer for storing data supplied from the outside, and a latch circuit for latching the input data output from the buffer in accordance with the internal clock, said clock generation circuit comprising:

a clock wiring having opposed first and second ends, through which a clock is transmitted from the first end to the second end; and a plurality of clock phase adjustment circuits for generating internal clocks in accordance with the clock supplied from the clock wiring, each clock phase adjustment circuit comprising:

a first-end side terminal and a second-end side terminal which are connected to a first-end side point and a second-end side point of the circuit, respectively, said points being positioned on both sides of a reference point of the clock wiring;

delay means for delaying a clock supplied from one of the terminals and outputting an internal clock; and delay control means for performing feedback control on a delay of the clock in the delay means in accordance with the phase of the clock supplied from the other terminal so that the phase of the internal clock matches the phase of the clock at the reference point of the clock wiring.

13. The semiconductor integrated circuit of claim 12 wherein:

the clock wiring in the clock generation circuit is turned down at the reference point so that a portion of the wiring from the first end to the reference point and a portion of the wiring from the reference point to the second end are positioned in parallel with each other; and the distance from the first-end side point to the reference point of the clock wiring corresponding to each clock phase adjustment circuit is equal to the distance from the second-end side point to the reference point of the clock wiring corresponding to each clock phase adjustment circuit.

14. The semiconductor integrated circuit of claim 13 wherein each of the clock phase adjustment circuits in the clock generation circuit performs feedback control on a delay in the delay means by using the delay control means, for a predetermined period of time, in accordance with a control signal supplied from the outside.

15. The semiconductor integrated circuit of claim 14 further comprising:

data delay means disposed between the input buffer and the latch circuit, for delaying the input data output from the input buffer; and input data delay control means for controlling a delay in the data delay means so as to reduce variation of relative phase difference between the input data output from the buffer and the internal clock output from each clock phase adjustment circuit, in the state where feedback control of a clock delay in the delay means in each clock phase adjustment means is not performed.

* * * * *